(12) United States Patent
Shiratake

(10) Patent No.: US 7,935,595 B2
(45) Date of Patent: May 3, 2011

(54) METHOD FOR MANUFACTURING SEMICONDUCTOR DEVICE

(75) Inventor: Shigeru Shiratake, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 1021 days.

(21) Appl. No.: 11/581,346

(22) Filed: Oct. 17, 2006

(65) Prior Publication Data

US 2007/0096204 A1    May 3, 2007

(30) Foreign Application Priority Data

Oct. 28, 2005   (JP) ................................ 2005-313661

(51) Int. Cl.
*H01L 21/00*    (2006.01)

(52) U.S. Cl. ......................... 438/257; 438/259; 438/270

(58) Field of Classification Search .................. 438/259, 438/257, 270
See application file for complete search history.

(56) References Cited

U.S. PATENT DOCUMENTS

| | | | |
|---|---|---|---|
| 6,063,669 A | 5/2000 | Takaishi | |
| 6,317,360 B1 | 11/2001 | Kanamori | |
| 6,770,535 B2 * | 8/2004 | Yamada et al. | 438/270 |
| 6,913,964 B2 * | 7/2005 | Hsu | 438/239 |
| 6,964,895 B2 * | 11/2005 | Hsu | 438/238 |
| 7,078,296 B2 * | 7/2006 | Chau et al. | 438/270 |
| 7,116,583 B2 * | 10/2006 | Sander et al. | 365/185.28 |
| 7,132,325 B2 * | 11/2006 | Abadeer et al. | 438/248 |
| 7,396,738 B1 * | 7/2008 | Lee | 438/427 |
| 7,432,139 B2 * | 10/2008 | Currie | 438/164 |
| 7,482,223 B2 * | 1/2009 | Higashitani et al. | 438/257 |
| 7,560,359 B2 * | 7/2009 | Park | 438/426 |
| 7,619,281 B2 * | 11/2009 | Seo et al. | 257/330 |
| 7,700,979 B2 * | 4/2010 | Shim | 257/244 |
| 7,701,002 B2 * | 4/2010 | Seo et al. | 257/330 |
| 7,709,324 B2 * | 5/2010 | Shiratake | 438/259 |
| 7,713,873 B2 * | 5/2010 | Kim et al. | 438/672 |
| 7,714,384 B2 * | 5/2010 | Seliskar | 257/331 |
| 2001/0025973 A1 | 10/2001 | Yamada et al. | |

(Continued)

FOREIGN PATENT DOCUMENTS

JP          7-66297          3/1995

(Continued)

OTHER PUBLICATIONS

Taiwanese Office Action, with English translation, issued in Taiwanese Patent Application No. 095139553, mailed Jun. 15, 2009.

(Continued)

*Primary Examiner* — Laura M Menz
(74) *Attorney, Agent, or Firm* — McDermott Will & Emery LLP

(57) ABSTRACT

A method for manufacturing a semiconductor device whereby the process is simplified and high performance can be obtained in both a trench-gate transistor and a planar transistor that has a thin gate insulating film when the two transistors are formed on the same semiconductor substrate. In a state in which the gate insulating film (11s) in a peripheral circuit region PE is covered by a protective film (12), a gate trench (18) is formed in a memory cell region M, after which a gate insulating film (19) that is thicker than the gate insulating film (11s) is formed on an inner wall of the gate trench (18) in a state in which the gate insulating film (11s) of the peripheral circuit region PE is still covered by the protective film (12).

17 Claims, 33 Drawing Sheets

U.S. PATENT DOCUMENTS

| | | | |
|---|---|---|---|
| 2002/0195647 A1 | 12/2002 | Aritome | |
| 2007/0082440 A1* | 4/2007 | Shiratake | 438/243 |
| 2007/0096204 A1* | 5/2007 | Shiratake | 257/330 |

FOREIGN PATENT DOCUMENTS

| | | |
|---|---|---|
| JP | 9-232535 | 9/1997 |
| JP | 09-232535 | 9/1997 |
| JP | 2000-077632 | 3/2000 |
| JP | 2001-210801 | 8/2001 |
| JP | 2003-007870 | 1/2003 |
| JP | 2003-086766 | 3/2003 |
| JP | 2004-14696 | 1/2004 |
| JP | 2004-022915 | 1/2004 |
| JP | 2005-142203 | 6/2005 |

OTHER PUBLICATIONS

Japanese Office Action, w/ partial English translation thereof, issued in Japanese Patent Application No. JP 2005-313661 dated Sep. 7, 2010.

* cited by examiner

METHOD FOR MANUFACTURING SEMICONDUCTOR DEVICE

TECHNICAL FIELD

The present invention relates to method for manufacturing a semiconductor device, and particularly relates to a method for manufacturing a semiconductor device having both a trench-gate transistor and a planar transistor.

BACKGROUND OF THE INVENTION

The recent miniaturization of DRAM (Dynamic Random Access Memory) cells has been accompanied by the necessity of shortening the gate length of memory cell transistors. However, short channel effects in a transistor become more severe as the gate length is shortened, and drawbacks occur whereby sub-threshold current increases. When the substrate impurity concentration is increased in order to minimize this effect, deterioration of the refresh characteristics in the DRAM is a severe drawback because of increased junction leakage.

A so-called trench-gate transistor (also referred to as a recess-channel transistor) in which a gate electrode is embedded in a groove formed on a silicon substrate has been emphasized as a means of overcoming these drawbacks (see Japanese Laid-open Patent Application Nos. H9-232535, 2001-210801, 2005-142203, H7-066297, and 2004-014696). Using a trench-gate transistor, the effective channel length (gate length) can be physically and adequately maintained, and it is possible to create precision DRAM having a minimum feature size of 90 nm or less.

On the other hand, in DRAM, since there is little need to make the gate length of the transistors in the peripheral circuit region compared with the transistor in the memory cell region, a normal planar transistor is formed in the peripheral circuit region.

Accordingly, trench-gate transistors and planar transistors should be simultaneously formed on a single semiconductor substrate.

However, the thickness of the gate oxide film must be reduced for the sake of low-voltage operation in most of the transistors formed in the peripheral circuit region, whereas a boost voltage is applied to the transistors formed in the memory cell region, and a high breakdown voltage is therefore required. Specifically, a thick gate insulating film is required in the memory cell region.

FIGS. 39 through 44 are used hereinafter to describe a conventional method for providing the memory cell region with a trench-gate transistor in which the gate insulating film is a thick oxide film, and providing the peripheral circuit region with a planar transistor in which the gate insulating film is a thin oxide film. In FIGS. 39 through 44, "region M" indicates the memory cell region, and "region PE" indicates the region provided with a planar transistor that uses a thin oxide film as the gate insulating film in the peripheral circuit region. The peripheral circuit region also includes a region (not shown) in which a power supply circuit and the like are formed, and which is a region other than region PE.

As shown in FIG. 39, a gate trench 202 is formed in region M of a semiconductor substrate 200 whose regions are separated by STI (Shallow Trench Isolation) 201. Although not shown in the drawing, sacrificial oxidation is then performed by thermal oxidation to remove damage and contamination from the etched surfaces inside the gate trench 202, after which a somewhat thick silicon oxide film 203 is formed by thermal oxidation on the entire surface that includes the inner wall of the gate trench 202, as shown in FIG. 40. As shown in FIG. 41, region M is then covered, a resist pattern 204 for exposing region PE is formed, and the silicon oxide film 203 in region PE is removed by wet etching using the resist pattern 204 as a mask. Then, after the resist pattern 204 is removed, the entire surface is again oxidized by thermal oxidation. The silicon oxide film 203 on the surface of the substrate 200 and the inner wall of the gate trench 202 in region M thereby grows thicker, as shown in FIG. 42, yielding a thick oxide film 205$t$ that serves as the gate insulating film of the trench-gate transistor. At the same time, a thin oxide film 205$s$ is formed in region PE to be the gate insulating film of the planar transistor.

A doped silicon film 206 is then formed on the entire surface so as to fill in the gate trench 202, as shown in FIG. 43, and the doped silicon film 206 is patterned in the shape of a gate electrode. The gate electrode 208 of the trench-gate transistor and the gate electrode 207 of the planar transistor are thereby formed, as shown in FIG. 44. Ion implantation is then performed for each semiconductor substrate 200 using the gate electrodes 207 and 208 as masks, source/drain diffusion regions 209 are formed in region PE, and source/drain diffusion regions 210 are formed in region M. A planar transistor having a thick gate insulating film is thereby formed in region PE, and a trench-gate transistor having a thin gate insulating film is formed in region M.

However, the conventional method described above has the following types of drawbacks.

Specifically, the method described above requires at least three thermal oxidation steps to be performed in the gate trench 202 that include sacrificial oxidation, thermal oxidation for forming the silicon oxide film 203, and thermal oxidation for causing the silicon oxide film 203 to grow into the thick oxide film 205$t$. Oxidation stress inside the gate trench 202 thereby increases, and the DRAM refresh characteristics are adversely affected.

Since the opening of the gate trench 202 becomes narrow as the size of the device is reduced, the oxidation rate inside the gate trench 202 decreases, and the oxidation rate inside the gate trench 202 therefore becomes lower than that of the flat portion (surface of the substrate 200). Therefore, when an attempt is made to form an oxide film in region PE at the same time as an oxide film having the necessary thickness is formed inside the gate trench 202, the oxide film on the surface of region PE becomes too thick. The silicon oxide film 203 on region PE must then be temporarily removed, as shown in FIG. 41.

SUMMARY OF THE INVENTION

The present invention was developed in order to overcome the drawbacks described above, and an object of the present invention is to provide a method for manufacturing a semiconductor device whereby the process is simplified and both transistors can be endowed with high performance in a case in which a trench-gate transistor having a thick gate insulating film, and a planar transistor having a thin gate insulating film are both formed on the same semiconductor substrate.

The above and other objects of the present invention can be accomplished by a method for manufacturing a semiconductor device that has a memory cell region and a peripheral circuit region, said method comprising:

a first step for forming a first gate insulating film on a semiconductor substrate in at least said peripheral circuit region;

a second step for covering said first gate insulating film with a protective film;

a third step for forming a gate trench in said memory cell region in a state in which said first gate insulating film on said peripheral circuit region is covered by said protective film; and a fourth step for forming a second gate insulating film that is thicker than said first gate insulating film on at least an inner wall of said gate trench in a state in which said first gate insulating film on said peripheral circuit region is covered by said protective film.

According to the present invention, a gate trench is formed in the memory cell region, and then a second gate insulating film that is thicker than the first gate insulating film is formed on the inner wall of the gate trench in a state in which the first gate insulating film on the peripheral circuit region is covered by a protective film. The first gate insulating film and the second gate insulating film can therefore be formed independently of each other. Accordingly, the number of oxidation steps performed in the gate trench can be reduced. Oxidation stress in the gate trench can thereby be reduced, and a degradation of the refresh characteristics can be prevented. Since the first gate insulating film and the second gate insulating film are formed independently rather than simultaneously, the film thickness and other characteristics are easily controlled. It is also possible to provide a method for manufacturing a semiconductor device whereby the process is simplified, and both transistors can be endowed with high performance in a case in which a trench-gate transistor having a thick gate insulating film, and a planar transistor having a thin gate insulating film are both formed on the same semiconductor substrate.

The abovementioned second gate insulating film in particular is preferably formed by a step for depositing a silicon oxide film by a CVD method, and by a step for thermal-oxidizing the interface between the silicon oxide film and the semiconductor substrate. The time needed to form the second gate insulating film in the gate trench can thereby be prevented from increasing even when further reduction in size narrows the opening of the gate trench, and an increase in oxidation stress can be suppressed.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

First Embodiment

FIGS. 1 through 18 are schematic views showing the process for manufacturing a semiconductor device that has a trench-gate transistor and a planar transistor according to a first embodiment of the present invention. In FIGS. 1 through 18, "region M" indicates the memory cell region in which the trench-gate transistor is formed, and "region PE" indicates the peripheral circuit region in which the planar transistor is formed.

Figure 1:
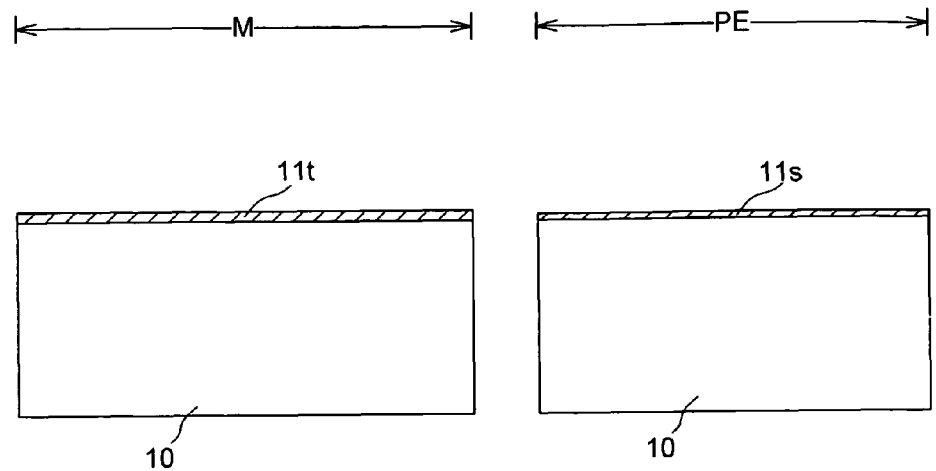
FIG. 1 is a process diagram showing a process of forming a thin oxide film and a thick oxide film that is a part of the manufacturing method of a semiconductor device according to a first embodiment of the present invention.

First, a thin oxide film 11s having a thickness of approximately 1.5 to 3 nm is formed on the surface of region PE of a semiconductor substrate 10, as shown in FIG. 1. A thick oxide film 11t having a thickness of approximately 4.5 to 6 nm is also formed in region M and in a region (not shown) in which a power supply circuit and the like are formed, and which is a region other than region PE of the peripheral circuit region. In a specific example, a thermal oxide film having a thickness of slightly less than 6 nm is formed on the entire surface of the semiconductor substrate 10 by thermal oxidation, the region other than region PE is covered by a resist mask, and the thermal oxide film on region PE is removed, after which the resist mask is removed, and the entire surface of the substrate 10 is cleaned with an acid. This cleaning removes a portion of the surface of the thermal oxide film on region M and on the region (not shown) in which a power supply circuit and the like are formed, and the thickness of the thermal oxide film is reduced to about 5 nm. Then, the entire surface is again thermal-oxidized to form a thin oxide film 11s having a thickness of about 3 nm on region PE, and a thick oxide film 1it having a thickness of about 6 nm on region M and the region (not shown) in which a power supply circuit and the like are formed. The thin oxide film 11s thereby formed is the gate insulating film of the planar transistor formed in region PE.

The thickness of the oxide film 11t formed in region M herein may be equal to that of the thin oxide film 11s. However, the oxide film lit in region M is preferably formed thick as described above so that in a case in which the gate electrode of the trench-gate transistor formed in region M is formed in a shape that protrudes further than the surface of the semiconductor substrate 10, even when the protruding portion is misaligned with respect to the gate trench 18, high breakdown voltage can be maintained in the misaligned portion as well. The thick oxide film 11t is also the gate insulating film of a transistor having a high breakdown voltage that is formed in a region (not shown) in which a power supply circuit and other components are formed.

Figure 2:
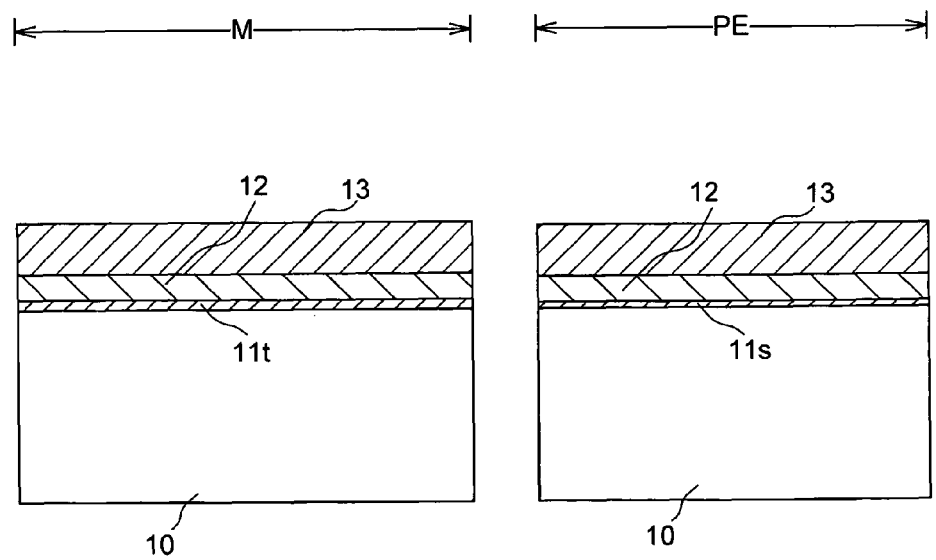
FIG. 2 is a process diagram showing a process of forming a phosphorus-doped amorphous silicon film and a silicon nitride film that is a part of the manufacturing method of a semiconductor device according to the first embodiment of the present invention.

In the subsequent step as shown in FIG. 2, a phosphorus-doped amorphous silicon film 12 as a protective film that has a thickness of approximately 10 to 30 nm is then formed by a CVD (Chemical Vapor Deposition) method in order to protect the thin oxide film 11s. A silicon nitride film 13 having a thickness of approximately 80 to 150 nm is then formed by an LP (Low Pressure)-CVD method.

Figure 3:
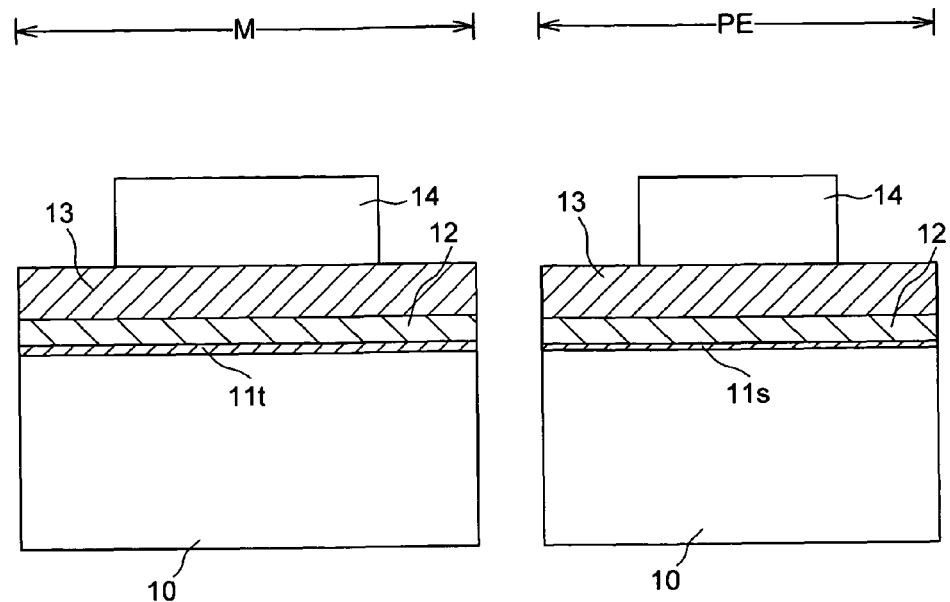
FIG. 3 is a process diagram showing a process of forming a resist pattern that is a part of the manufacturing method of a semiconductor device according to the first embodiment of the present invention.

As shown in FIG. 3, a resist pattern 14 is formed on each element separation region formed as a region for separating elements according to the STI (Shallow Trench Isolation) technique.

Figure 4:
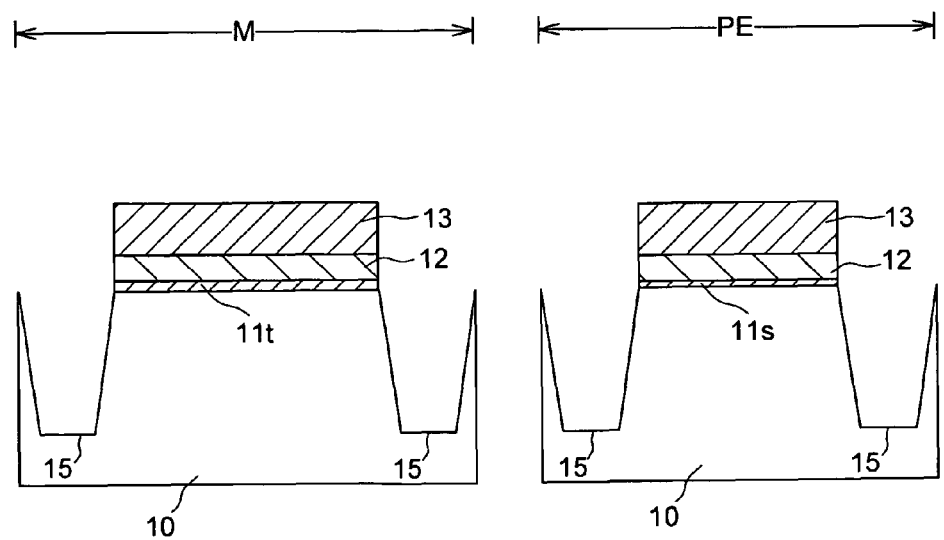
FIG. 4 is a process diagram showing a process of forming a trench used for STI that is a part of the manufacturing method of a semiconductor device according to the first embodiment of the present invention.

As shown in FIG. 4, after the silicon nitride films 13 are patterned using the resist patterns 14 as a mask, and the resist patterns 14 are then removed, the phosphorus-doped amorphous silicon films 12, the thick oxide films 11t, the thin oxide films 11s, and the semiconductor substrate 10 are dry-etched using the patterned silicon nitride films 13 as masks. The phosphorus-doped amorphous silicon films 12, the thick oxide films 11t, and the thin oxide films 11s are thereby patterned, and trenches 15 used for STI are also formed in the semiconductor substrate 10.

Figure 5:
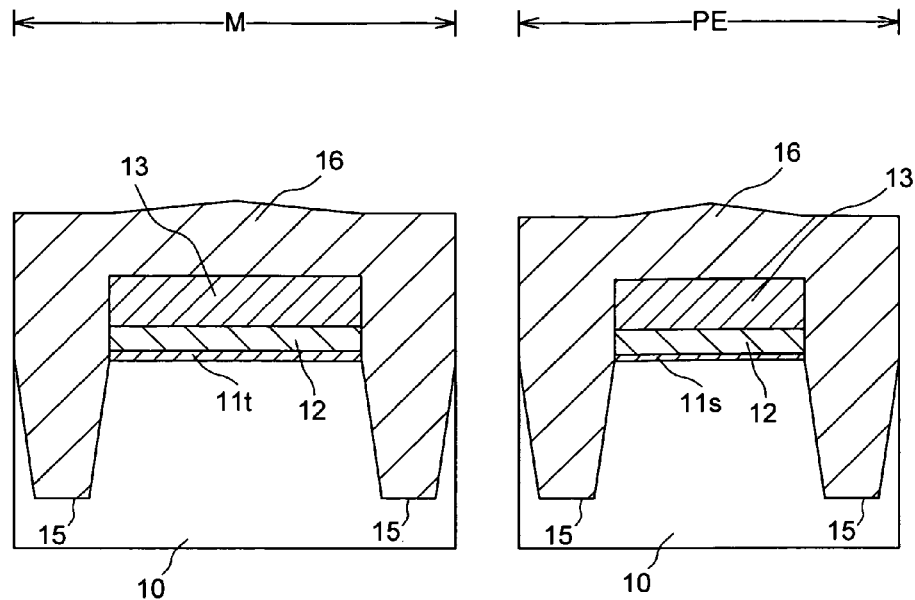
FIG. 5 is a process diagram showing a process of forming silicon oxide films that is a part of the manufacturing method of a semiconductor device according to the first embodiment of the present invention.

A thermal oxidation treatment is then performed in order to remove the etching damage from the inner walls of the trenches 15, after which silicon oxide films 16 are formed on the entire surface by an HDP (High-Density Plasma)-CVD method so as to fill in the trenches 15, as shown in FIG. 5.

Figure 6:
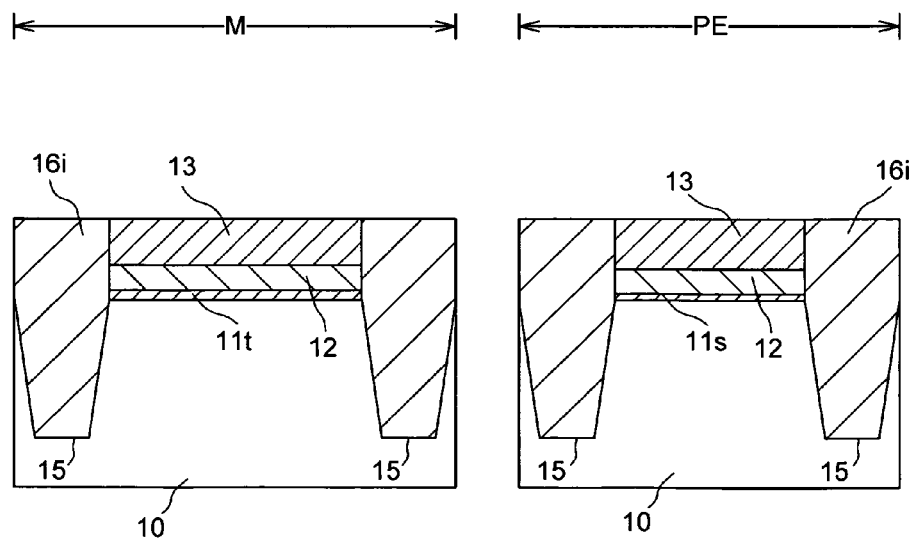
FIG. 6 is a process diagram showing a process of forming element separation regions that is a part of the manufacturing method of a semiconductor device according to the first embodiment of the present invention.

CMP (Chemical Mechanical Polishing) is then performed using the silicon nitride films 13 as a stopper, the silicon oxide films 16 on the silicon nitride films 13 are removed by polishing so that the silicon oxide films 16 remain in the trenches 15. Element separation regions 16i are thereby formed, as shown in FIG. 6.

Figure 7:
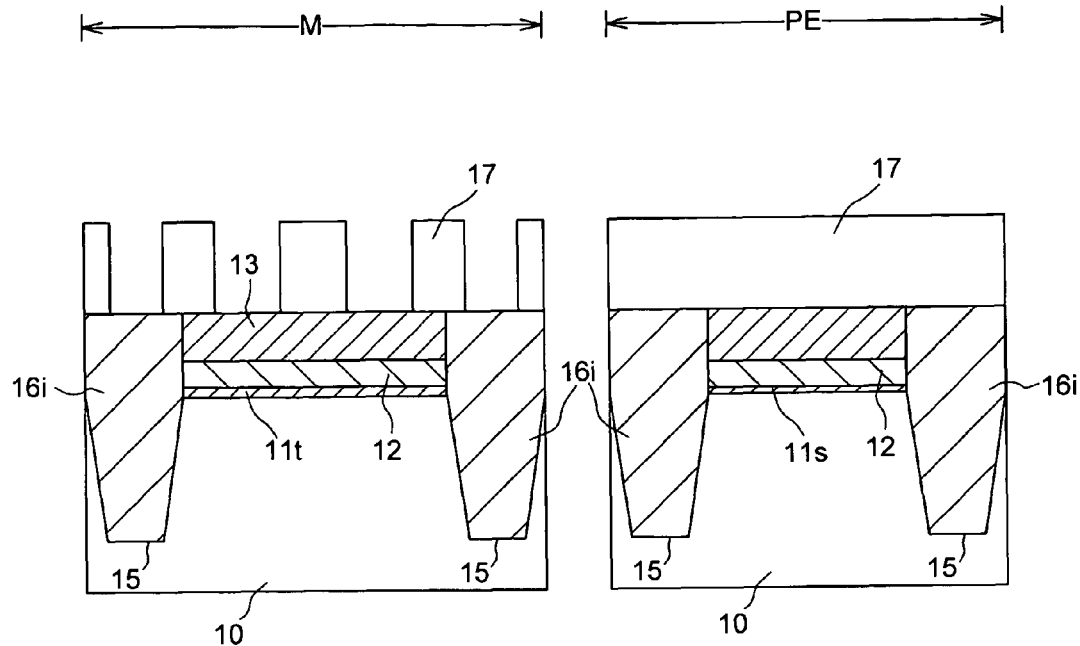
FIG. 7 is a process diagram showing a process of forming a resist pattern that is a part of the manufacturing method of a semiconductor device according to the first embodiment of the present invention.

As shown in FIG. 7, a resist pattern 17 that is provided with a plurality of openings is then formed on region M in order to form the gate trenches of the trench-gate memory cell transistor in region M. Region PE is completely covered at this time by resist patterns 17. Openings are also formed in the resist pattern 17 above the element separation regions 16i of region M in order to be used for a gate trench that is formed in an adjacent memory cell region (not shown).

Figure 8:
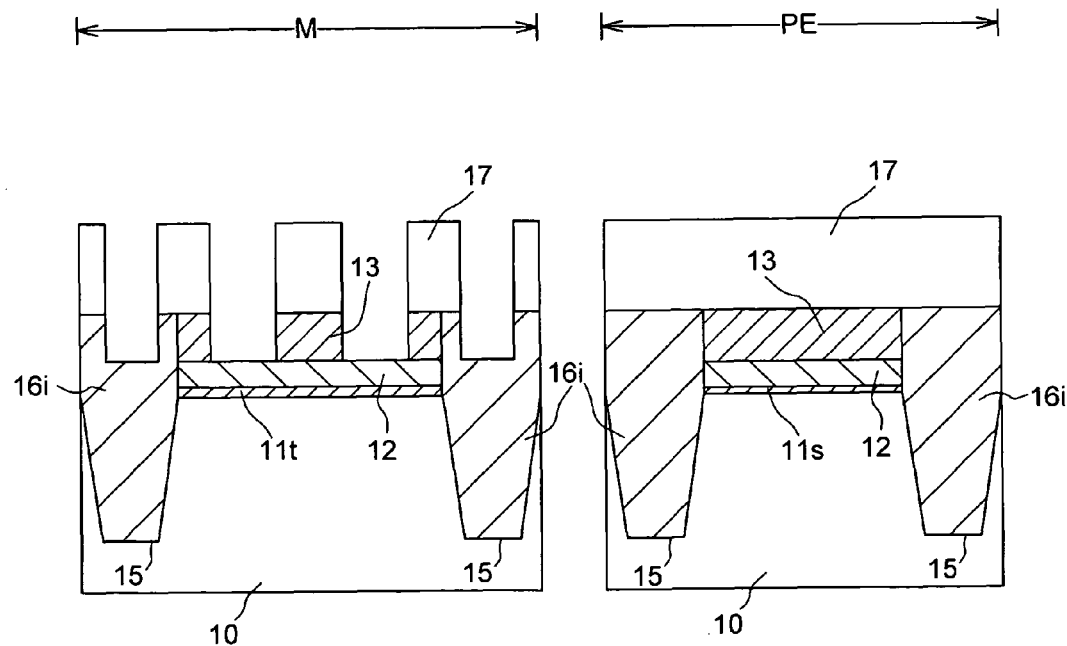
FIG. 8 is a process diagram showing a process of patterning the silicon nitride film that is a part of the manufacturing method of a semiconductor device according to the first embodiment of the present invention.

Using the resist pattern 17 as a mask, the silicon nitride film 13 is then patterned in the shape of the mask, as shown in FIG. 8.

Figure 9:
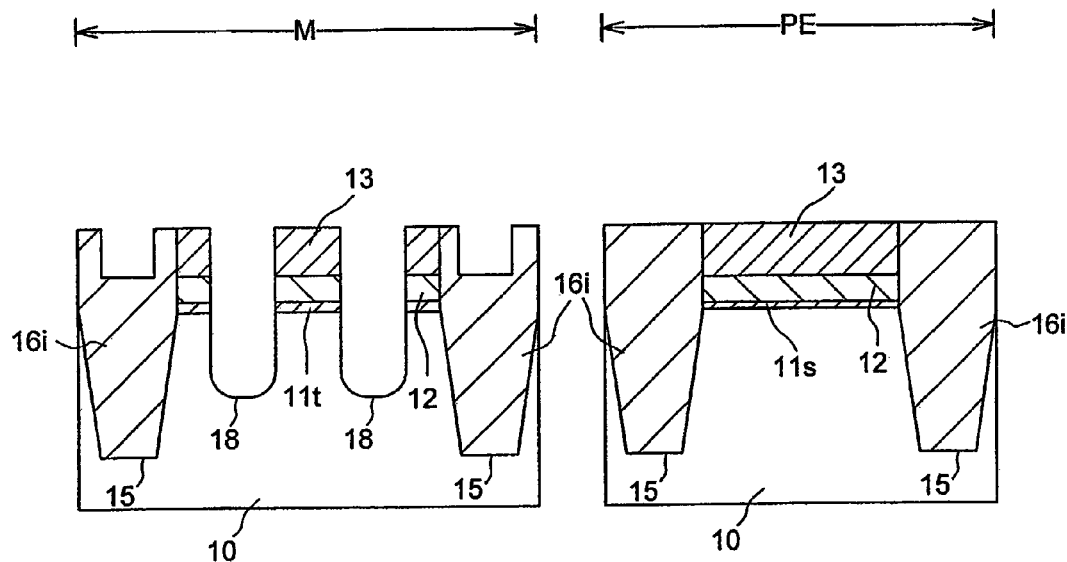
FIG. 9 is a process diagram showing a process of forming gate trenches that is a part of the manufacturing method of a semiconductor device according to the first embodiment of the present invention.

After the resist pattern 17 is removed, the phosphorus-doped amorphous silicon film 12 and the thick oxide film 11t are etched, and the semiconductor substrate 10 is also etched, whereby gate trenches 18 are formed in the semiconductor substrate 10, as shown in FIG. 9. The silicon nitride film 13 that was used as a mask for forming the STI trenches 15 shown in FIG. 4 thus remains without being removed, and is also used as a mask for forming the gate trenches 18, as shown in FIG. 9.

Figure 10:
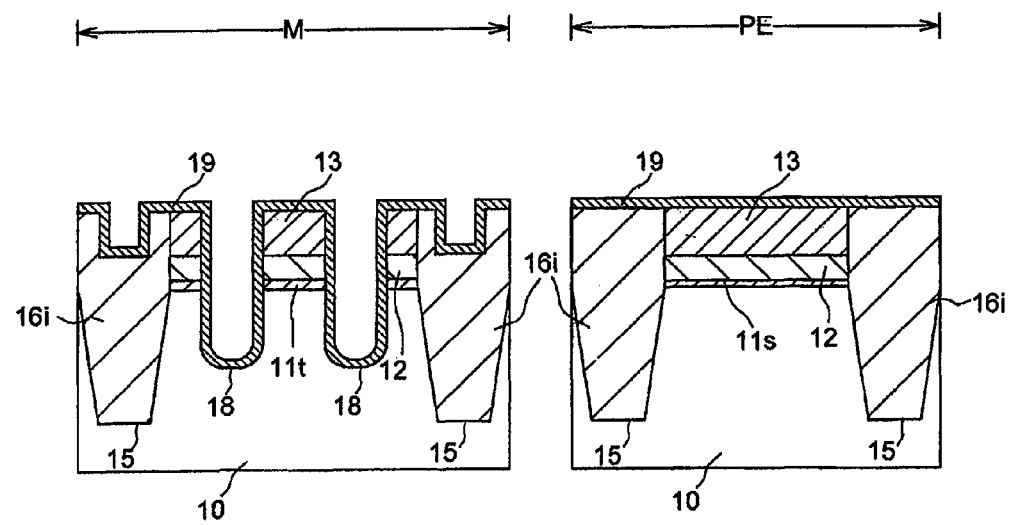
FIG. 10 is a process diagram showing a process of forming a silicon oxide film that is a part of the manufacturing method of a semiconductor device according to the first embodiment of the present invention.

Sacrificial oxidation is then performed by thermal oxidation to remove damage and contamination from the etched surfaces inside the gate trenches 18, and the sacrificial oxide film is then removed by wet etching. A silicon oxide film 19 is then formed to act as the gate insulating film of the memory cell transistor, as shown in FIG. 10. This silicon oxide film 19 must also have high voltage resistance as described above, and preferably has a thickness of approximately 4.5 to 6 nm. The silicon oxide film 19 herein is preferably formed by a process in which a CVD oxide film (preferably a HTO (High Temperature Oxide)) having a thickness of approximately 3.5 to 5.5 nm is deposited by a CVD method at a temperature of approximately 800° C., after which the CVD oxide film is thermally oxidized at a temperature of approximately 1050° C. in order to densify the CVD oxide film, remove impurities, and modify the interface between the CVD oxide film and the semiconductor substrate 10. The time needed to form the second gate insulating film in the gate trench can thereby be prevented from increasing even when further reduction in size narrows the opening of the gate trench, and an increase in oxidation stress can also be suppressed.

In contrast, when the full-thickness portion of the silicon oxide film 19 is formed by thermal oxidation, not only is the oxidation time lengthened, but oxidizing species also diffuse into the interface between the semiconductor substrate 10 and the element separation regions (STI) 16i. This causes a cubical expansion because the STI 16i are oxidized, thereby creating stress in the semiconductor substrate 10 and adversely affecting the junction characteristics of the DRAM. Accordingly, the silicon oxide film 19 is preferably formed according to the method described above. At this time, since the thin oxide film 11s formed on the semiconductor substrate 10 in region PE is covered by the phosphorus-doped amorphous silicon film 12 that is the protective film, it is possible to prevent a CVD oxide film from being deposited on the thin oxide film 11s, and to prevent the thin oxide film 11s from becoming thicker as a result of thermal oxidation.

Figure 11:
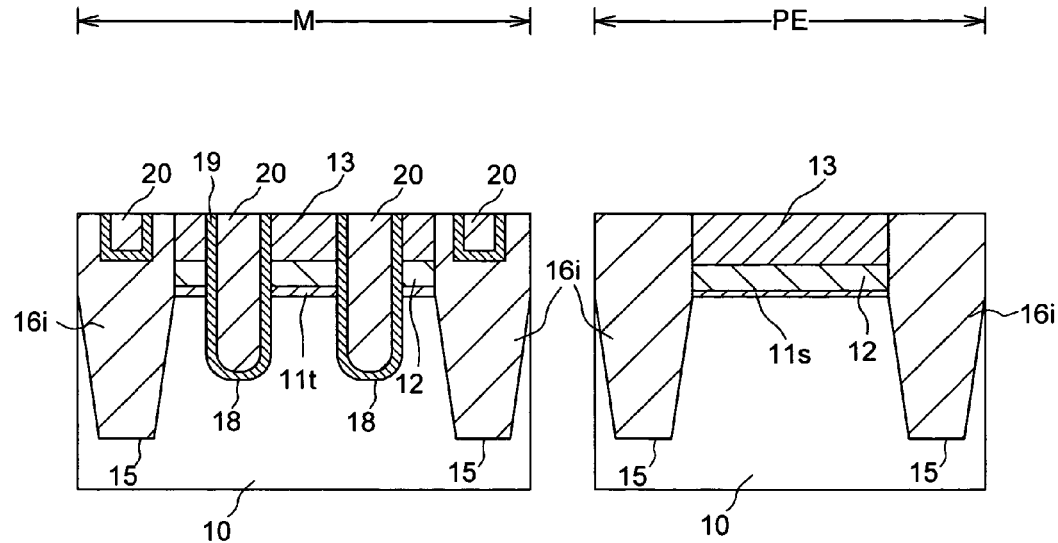
FIG. 11 is a process diagram showing a process of forming a phosphorus-doped amorphous silicon films into gate trenches that is a part of the manufacturing method of a semiconductor device according to the first embodiment of the present invention.

In order to form the gate electrode of the trench-gate transistor, an amorphous silicon film that is doped with phosphorus as an N-type impurity is then formed on the entire surface that includes the insides of the gate trenches 18. Phosphorus-doped amorphous silicon films 20 are then embedded in the gate trenches 18 as shown in FIG. 11, by performing a planarization process according to a CMP method in which the silicon nitride film 13 is used as a stopper.

Figure 12:
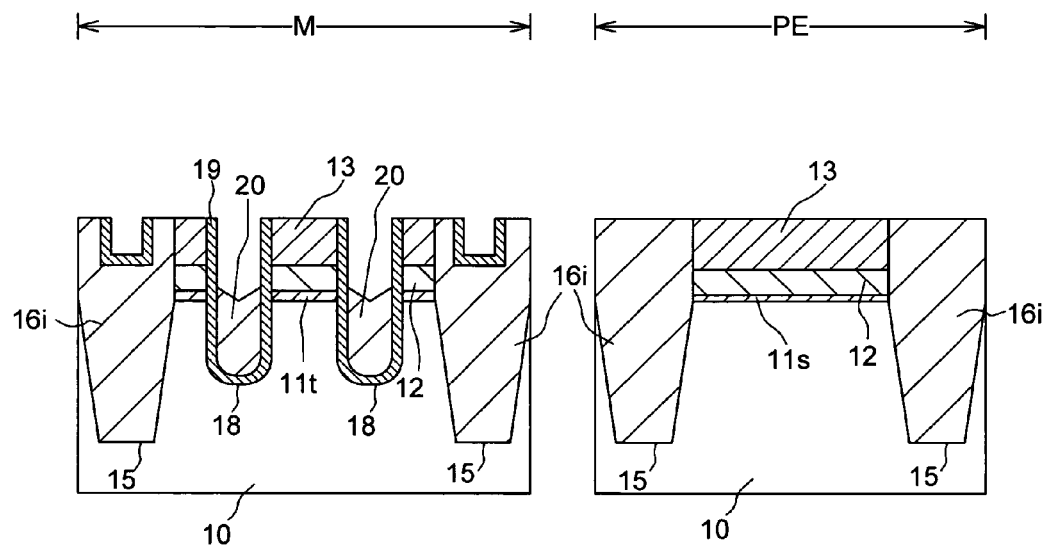
FIG. 12 is a process diagram showing a process of etching-back the phosphorus-doped amorphous silicon films that is a part of the manufacturing method of a semiconductor device according to the first embodiment of the present invention.

The phosphorus-doped amorphous silicon films 20 in the gate trenches 18 are then etched back to about the same position as the thick oxide film 11t by dry etching, as shown in FIG. 12.

Figure 13:
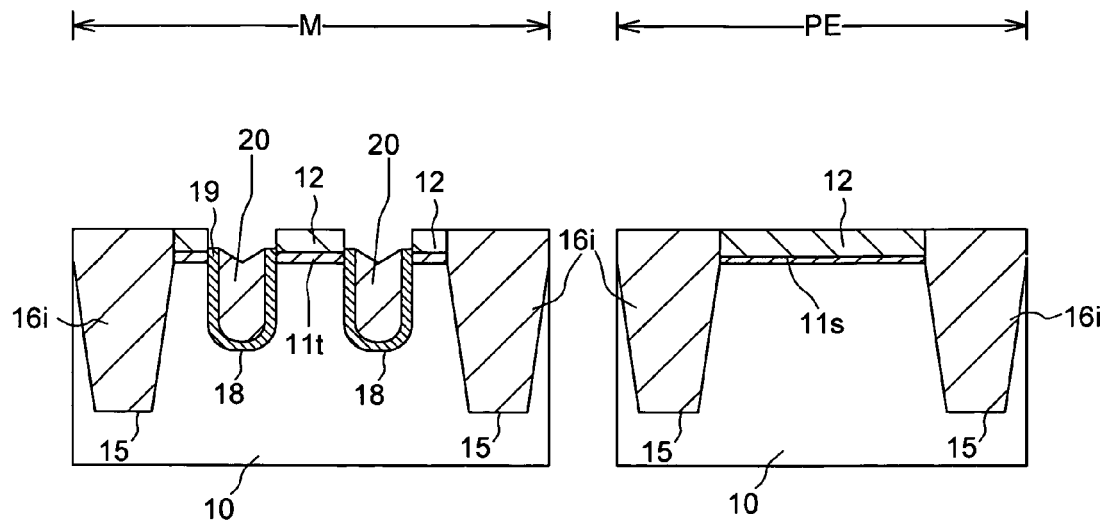
FIG. 13 is a process diagram showing a process of removing the silicon nitride film, the upper portions of the element separation regions, and the upper portions of the silicon oxide films that is a part of the manufacturing method of a semiconductor device according to the first embodiment of the present invention.

Wet etching is then performed to remove the silicon nitride film 13, the upper portions of the element separation regions 16i, and the upper portions of the silicon oxide films 19. The upper surfaces of the element separation regions 16i and the phosphorus-doped amorphous silicon film 12 are thereby aligned with each other, as shown in FIG. 13. In this arrangement, the phosphorus-doped amorphous silicon film 12 is formed on the gate insulating film 11s in region PE, and is made to function as a protective film when the nitride film 13 (see FIG. 12) used as a mask for forming the gate trench 18 is removed. It is therefore possible to prevent the gate insulating film 11s from being damaged.

Figure 14:
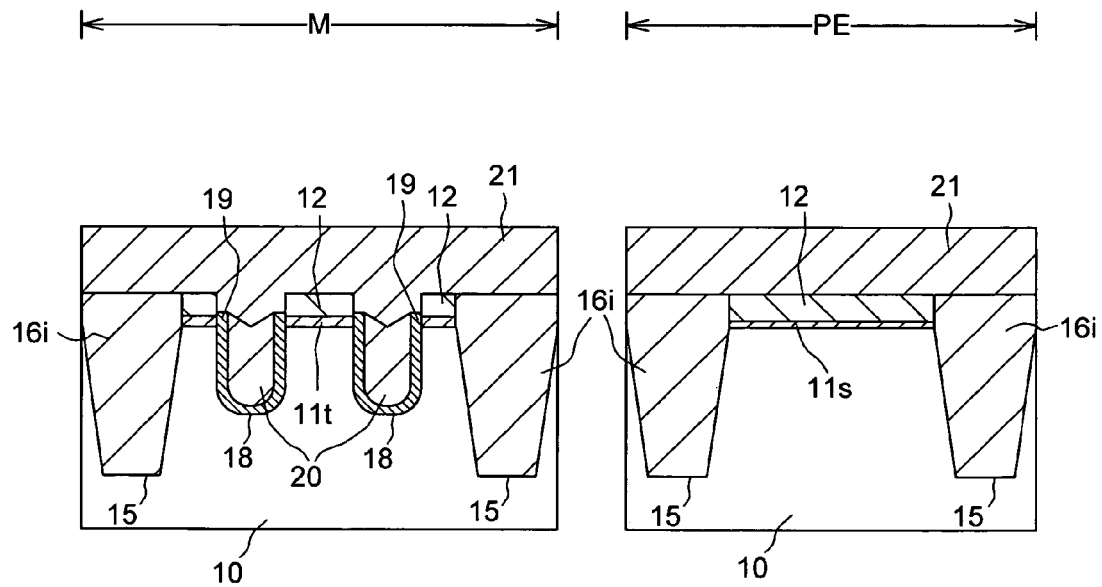
FIG. 14 is a process diagram showing a process of forming a phosphorus-doped amorphous silicon film that is a part of the manufacturing method of a semiconductor device according to the first embodiment of the present invention.

A CVD method is then used to form an amorphous silicon film (phosphorus-doped amorphous silicon film) 21 that is doped with phosphorus as an N-type impurity and has a thickness of approximately 30 to 80 nm on the entire surface, as shown in FIG. 14.

Figure 15:
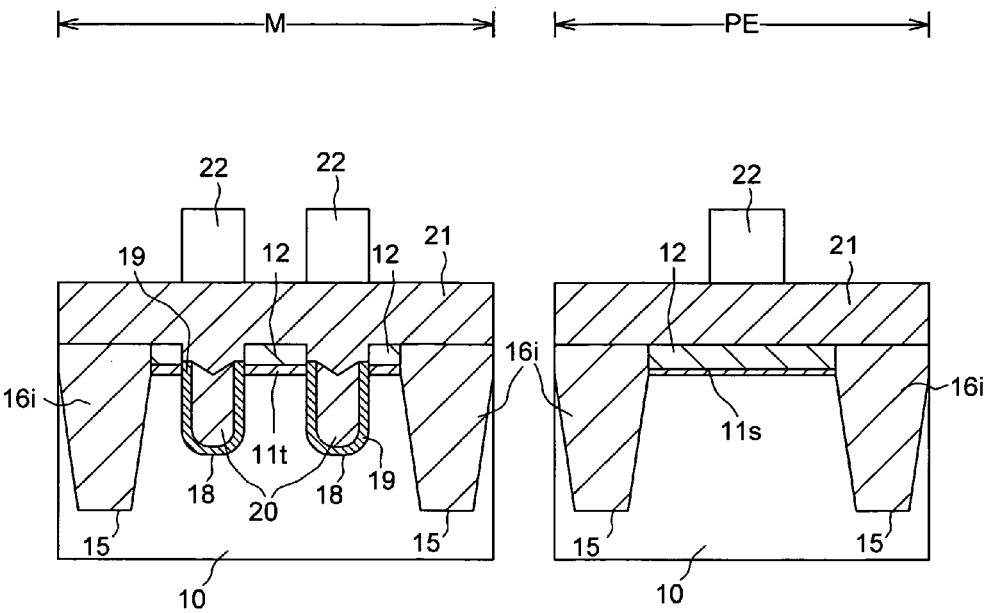
FIG. 15 is a process diagram showing a process of forming a resist pattern that is a part of the manufacturing method of a semiconductor device according to the first embodiment of the present invention.

A resist pattern 22 used to form a gate electrode is then formed on the phosphorus-doped amorphous silicon film 21, as shown in FIG. 15.

Figure 16:
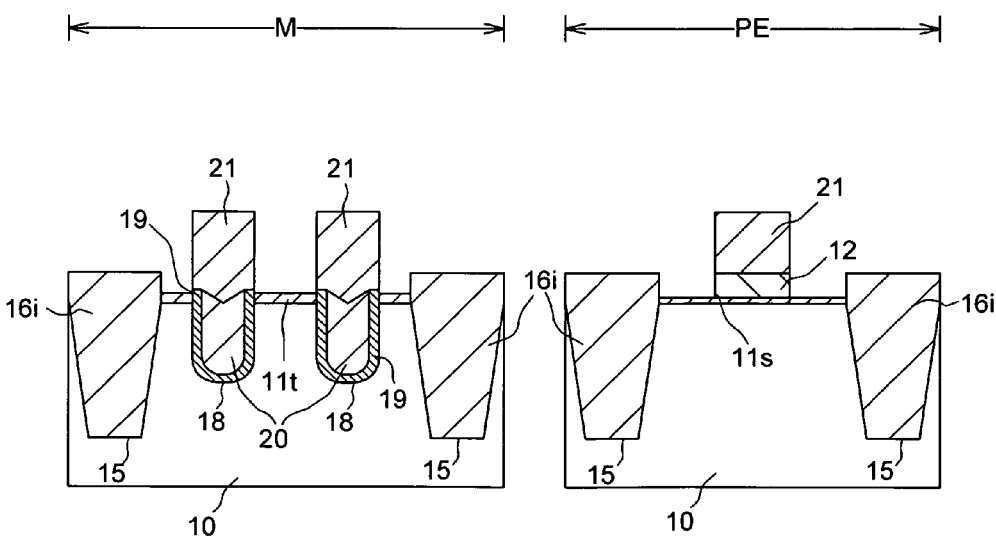
FIG. 16 is a process diagram showing a process of patterning layered films that is a part of the manufacturing method of a semiconductor device according to the first embodiment of the present invention.

The phosphorus-doped amorphous silicon film 21 is then patterned using a resist pattern 22 as a mask, as shown in FIG. 16. A gate electrode of a trench-gate transistor composed of the phosphorus-doped amorphous silicon films 20 and 21 is thereby formed in region M, and a gate electrode of a planar transistor composed of the phosphorus-doped amorphous silicon films 12 and 21 is formed in region PE.

The example described herein is of a case in which the patterned amorphous silicon films 21 are not misaligned with respect to the gate trenches 18 in region M. However, when misalignment does occur, the amorphous silicon films 21 remain on the thick oxide film lit and become portions of a gate electrode. In this type of case, the thick oxide film 11t functions as a portion of the gate insulating film in this trench-gate transistor. However, since the oxide film t is formed so as to have about the same thickness as the silicon oxide films 19 in the gate trenches 18, a reduction in the breakdown voltage thereof can be minimized.

Figure 17:
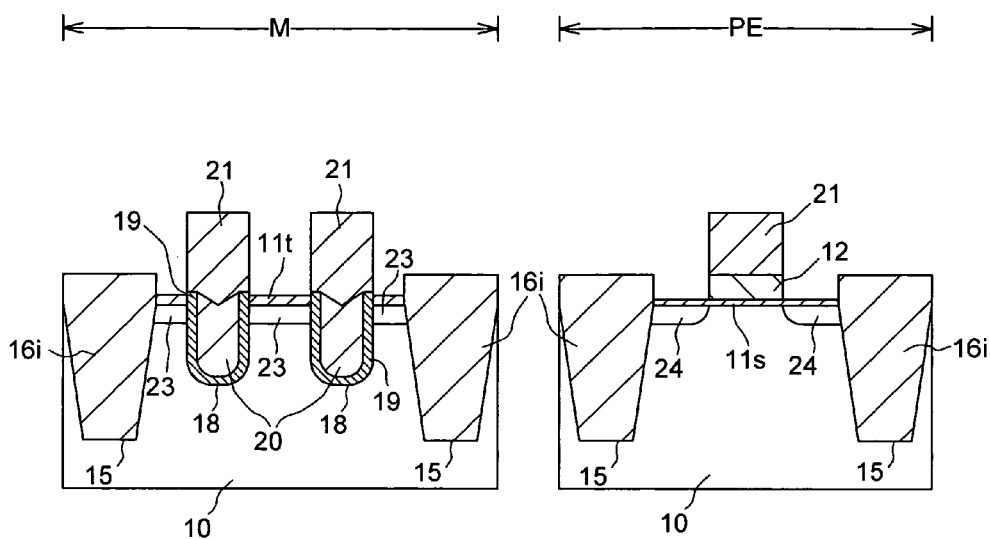
FIG. 17 is a process diagram showing a process of forming source/drain diffusion regions that is a part of the manufacturing method of a semiconductor device according to the first embodiment of the present invention.

N-type source/drain diffusion regions 23 are formed in region M, and N-type source/drain diffusion regions 24 are formed in region PE by ion implantation of an N-type impurity into regions M and PE using each gate electrode as a mask, as shown in FIG. 17. A trench-gate memory cell transistor is thereby formed in region M, and a planar transistor is formed in region PE.

The amorphous silicon films 12, 20 and 21 are converted from amorphous silicon films to polycrystalline silicon films by the heat treatment performed to activate the source/drain diffusion regions, or by a subsequent heating process.

Figure 18:
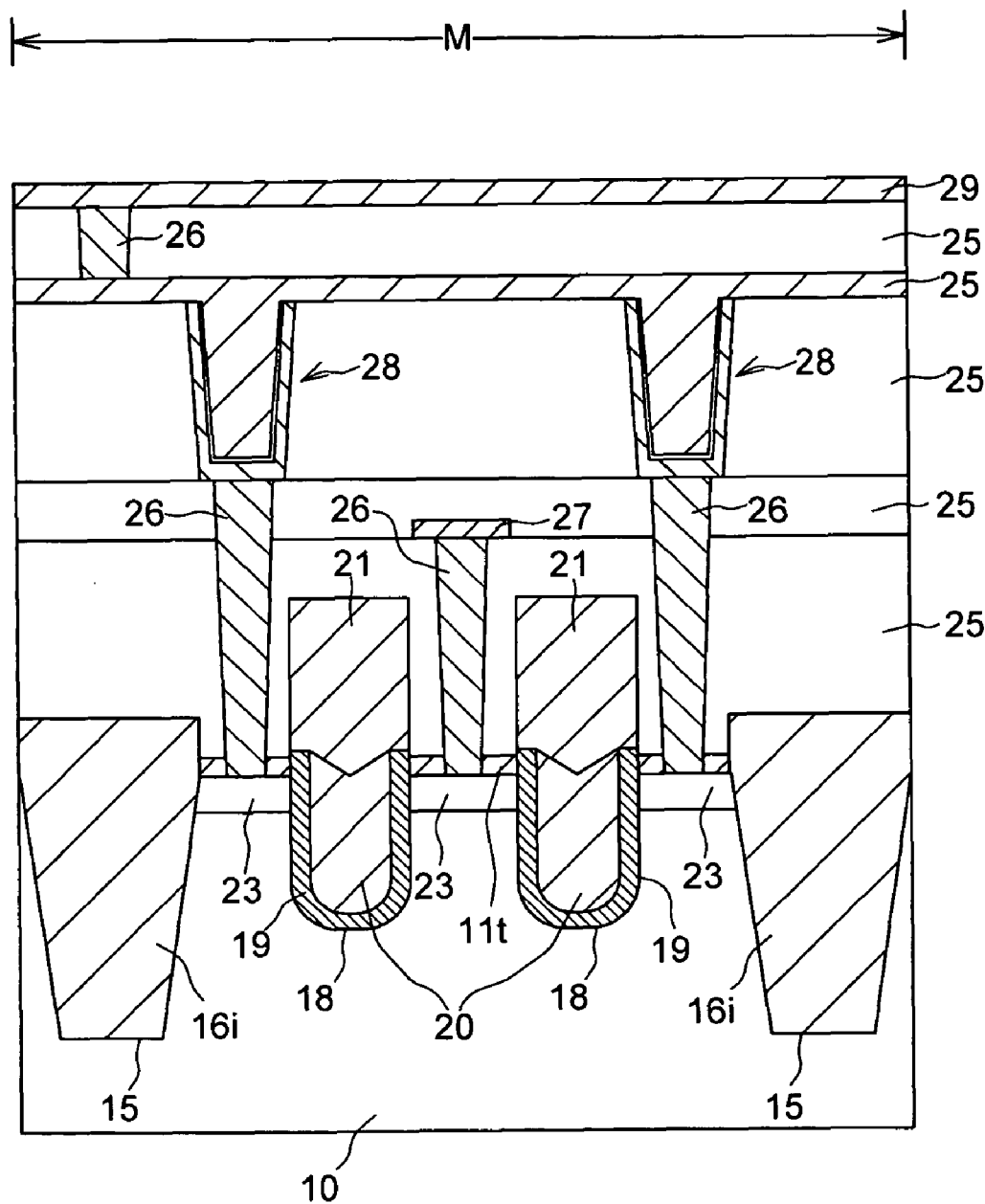
FIG. 18 is a process diagram showing a process of forming various wiring patterns and cell capacitors that is a part of the manufacturing method of a semiconductor device according to the first preferred embodiment of the present invention.

Various types of wiring or cell capacitors are then layered in region M using a common method. Specifically, DRAM having a trench-gate memory cell transistor is formed by a process in which an interlayer insulating film 25 is formed on the memory cell transistor, and a contact plug 26 that pass through the interlayer insulating film 25, a bit line 27, a cell capacitor 28, Al wiring 29, and other components are formed, as shown in FIG. 18.

In the present embodiment as described above, a thin oxide film 11s is formed in advance to function as the gate insulating film of the planar transistor on the semiconductor substrate 10 of the peripheral circuit region PE, and this thin oxide film 11s is covered by the amorphous silicon film 12. In this state, a gate trench 18 is formed in memory cell region M, and a gate insulating film 19 that is thicker than the gate insulating film 11s is formed on the inner wall of the gate trench 18. Since the amorphous silicon film 12 thereby functions as a protective film for preventing growth of the gate insulating film 11s, the gate insulating film 19 can be made thick while the gate insulating film 11s remains thin. Specifically, the gate insulating film 11s and the gate insulating film 19 can be formed independently of each other. The number of oxidation steps performed in the gate trench 18 can therefore be reduced.

According to the present embodiment, oxidation stress in the gate trench 18 can be reduced, and a degradation of the refresh characteristics can be prevented. Since the gate insulating film 11s and the gate insulating film 19 are formed independently rather than simultaneously, the film thickness and other characteristics are easily controlled.

Second Embodiment

As a second embodiment, an example will next be described in which the present invention is applied when a trench-gate transistor having a thick oxide film as the gate insulating film is formed in the memory cell region in the same manner as in the first embodiment, and a dual-gate-structured transistor having a thin oxide film as the gate insulating film is formed in the peripheral circuit region. In a dual-gate structure, a gate electrode that includes N-type polycrystalline silicon into which an N-type impurity (phosphorus or the like) is introduced is used as the gate electrode of an N-channel transistor, and a gate electrode that includes P-type polycrystalline silicon into which a P-type impurity (boron or the like) is introduced is used in a P-channel transistor.

FIGS. 19 through 38 are schematic views showing the process for manufacturing a semiconductor device that has a trench-gate transistor and a dual-gate-structured transistor according to a second embodiment of the present invention. In FIGS. 19 through 38, "region M" indicates the memory cell region in which the trench-gate transistor is formed, and "region P" and "region N" are provided to the peripheral circuit region, wherein "region P" is a region (also referred to as a P-type peripheral circuit region) in which a planar P-channel transistor provided with a gate electrode that includes P-type polycrystalline silicon is formed, and "region N" is a region (also referred to as an N-type peripheral circuit region) in which a planar N-channel transistor provided with a gate electrode that includes N-type polycrystalline silicon is formed.

Figure 19:
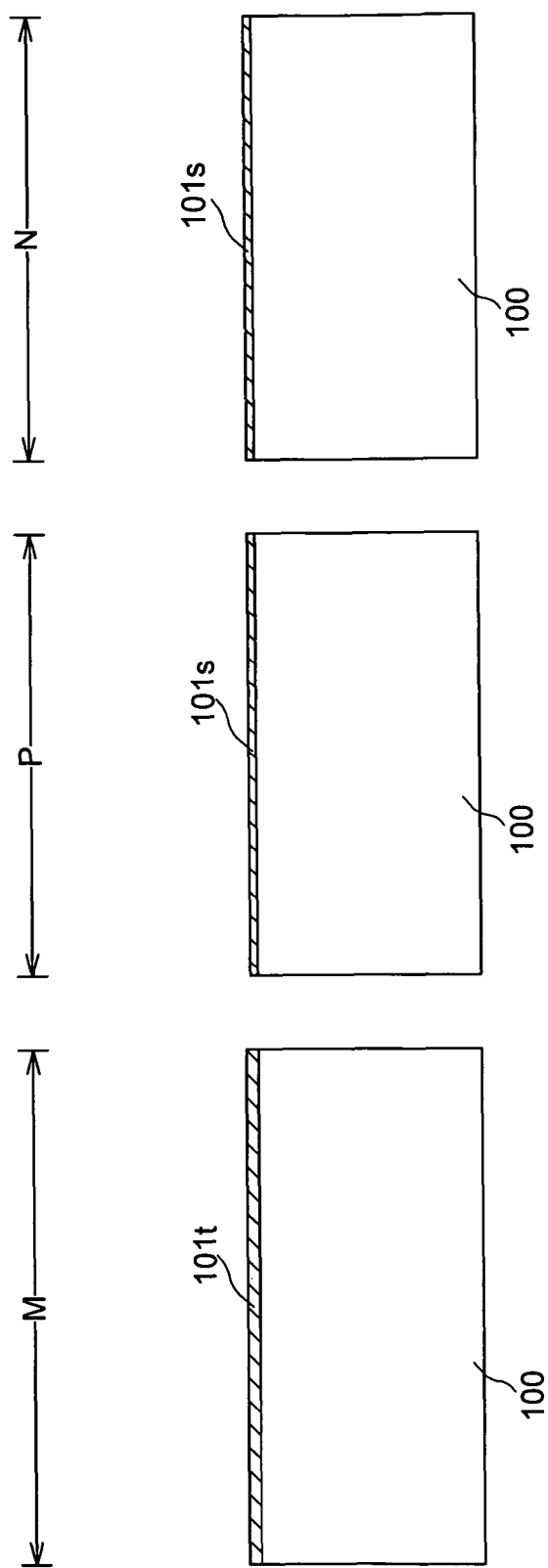
FIG. 19 is a process diagram showing a process of forming a thin oxide film and a thick oxide film that is a part of the manufacturing method of a semiconductor device according to a second embodiment of the present invention.

First, a thin oxide film 101s having a thickness of approximately 1.5 to 3 nm is formed on the surface of regions P and N of a semiconductor substrate 100, as shown in FIG. 19. A thick oxide film 101t having a thickness of approximately 4.5 to 6 nm is also formed in region M and in a region (not shown) in which a power supply circuit and the like are formed, and which is a region other than region P or N of the peripheral circuit region. Specifically, the thin oxide film 101s and the thick oxide film 101t are formed in the same manner as the thin oxide film 11s and the thick oxide film t in the process shown in FIG. 1 in the abovementioned first embodiment. The thin oxide film 101s thus formed is the gate insulating film of a dual-gate-structured planar transistor formed in regions P and N.

The thickness of the oxide film 101t formed in region M may be the same as that of the thin oxide film 101s, but a thick film is preferred for the same reason as in the first embodiment. The thick oxide film 101t is the gate insulating film of a transistor having a high breakdown voltage that is formed in a region (not shown) in which a power supply circuit and other components are formed, the same as the thick oxide film 11t in the first embodiment.

Figure 20:
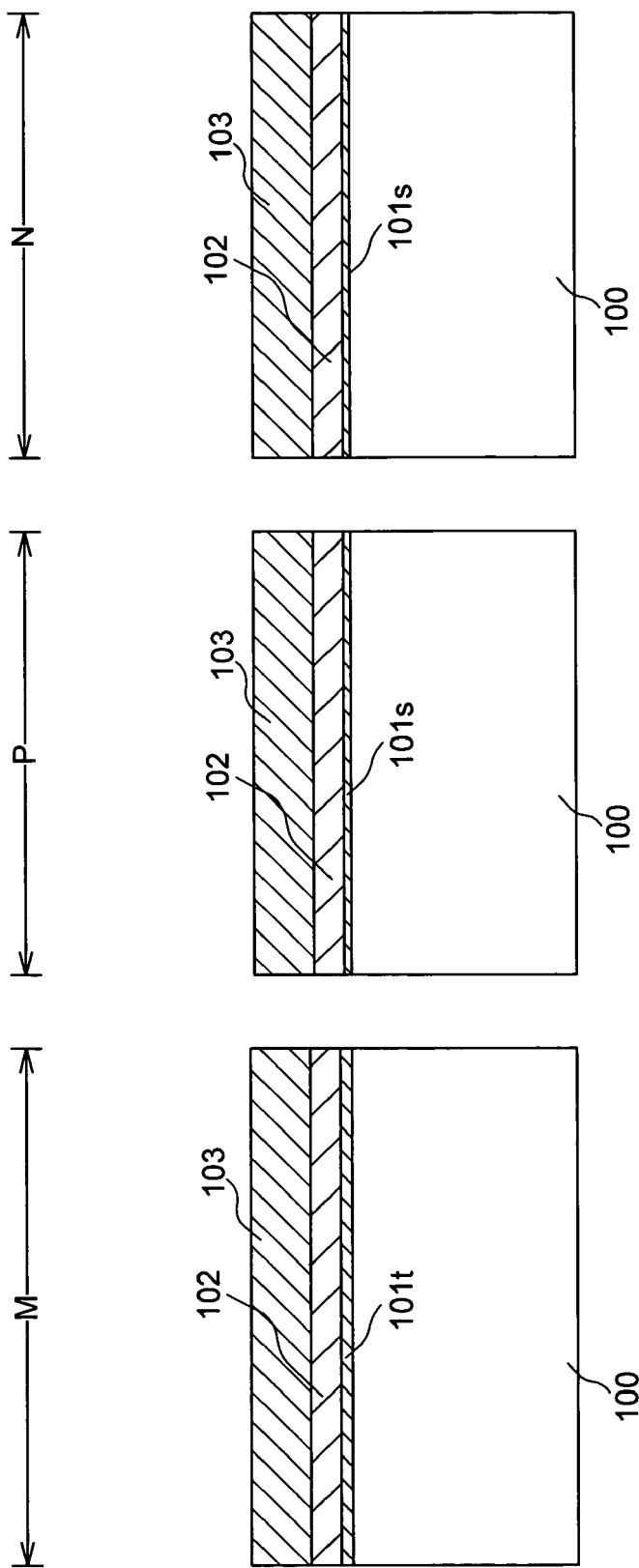
FIG. 20 is a process diagram showing a process of forming a non-doped amorphous silicon film and a silicon nitride film that is a part of the manufacturing method of a semiconductor device according to the second embodiment of the present invention.

In the subsequent step as shown in FIG. 20, a non-doped amorphous silicon film 102 as a protective film that has a thickness of approximately 10 to 30 nm is then formed by a CVD (Chemical Vapor Deposition) method in order to protect the thin oxide film 101s. In the present embodiment, since a dual-gate-structured transistor is formed in regions P and N of the peripheral circuit region, a non-doped amorphous silicon film is used as the protective film instead of the doped amorphous silicon film used in the abovementioned first embodiment. A silicon nitride film 103 having a thickness of approximately 80 to 150 nm is then formed by an LP (Low Pressure)-CVD method.

Figure 21:
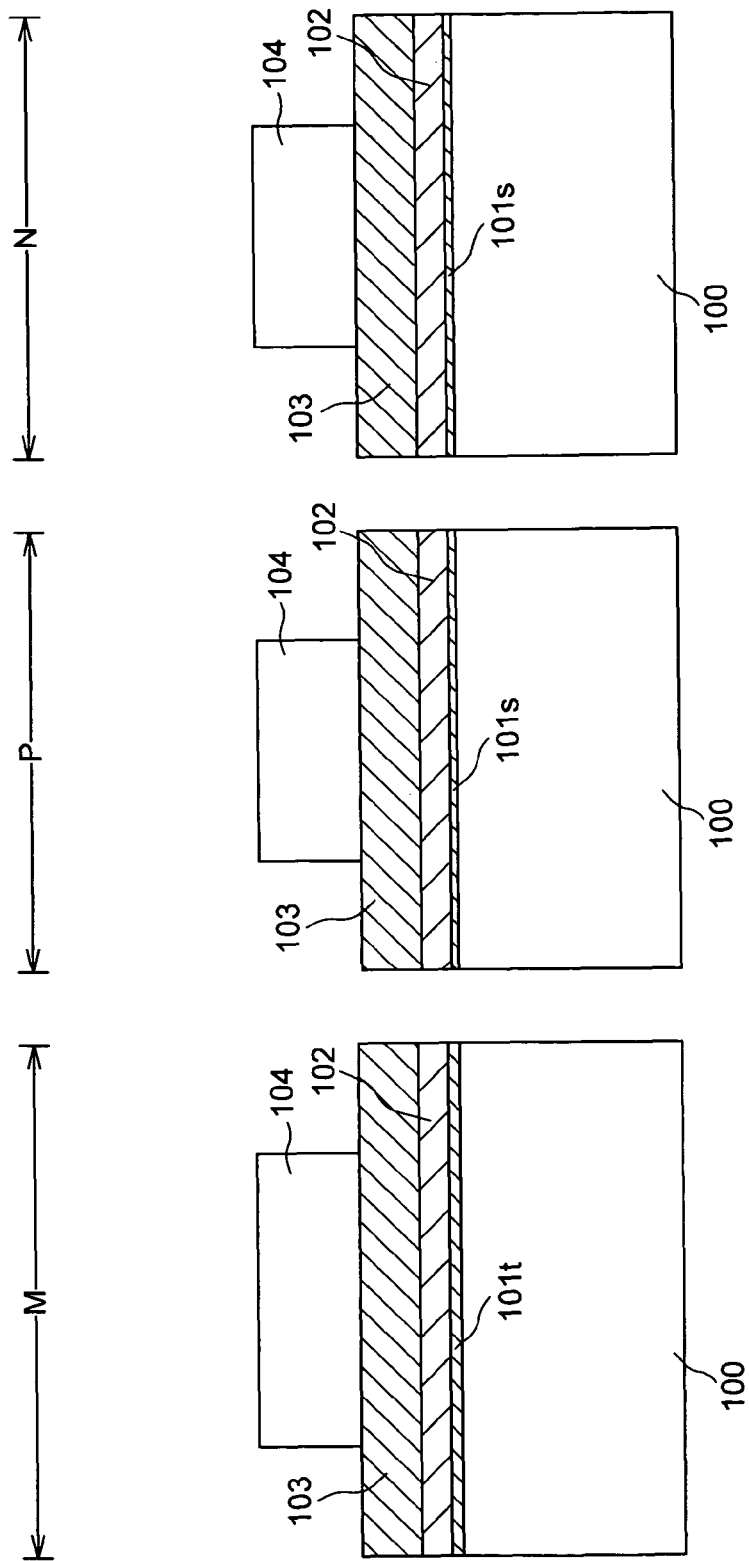
FIG. 21 is a process diagram showing a process of forming a resist pattern that is a part of the manufacturing method of a semiconductor device according to the second embodiment of the present invention.

As shown in FIG. 21, a resist pattern 104 is formed on each element separation region formed as a region for separating elements according to the STI (Shallow Trench Isolation) technique.

Figure 22:
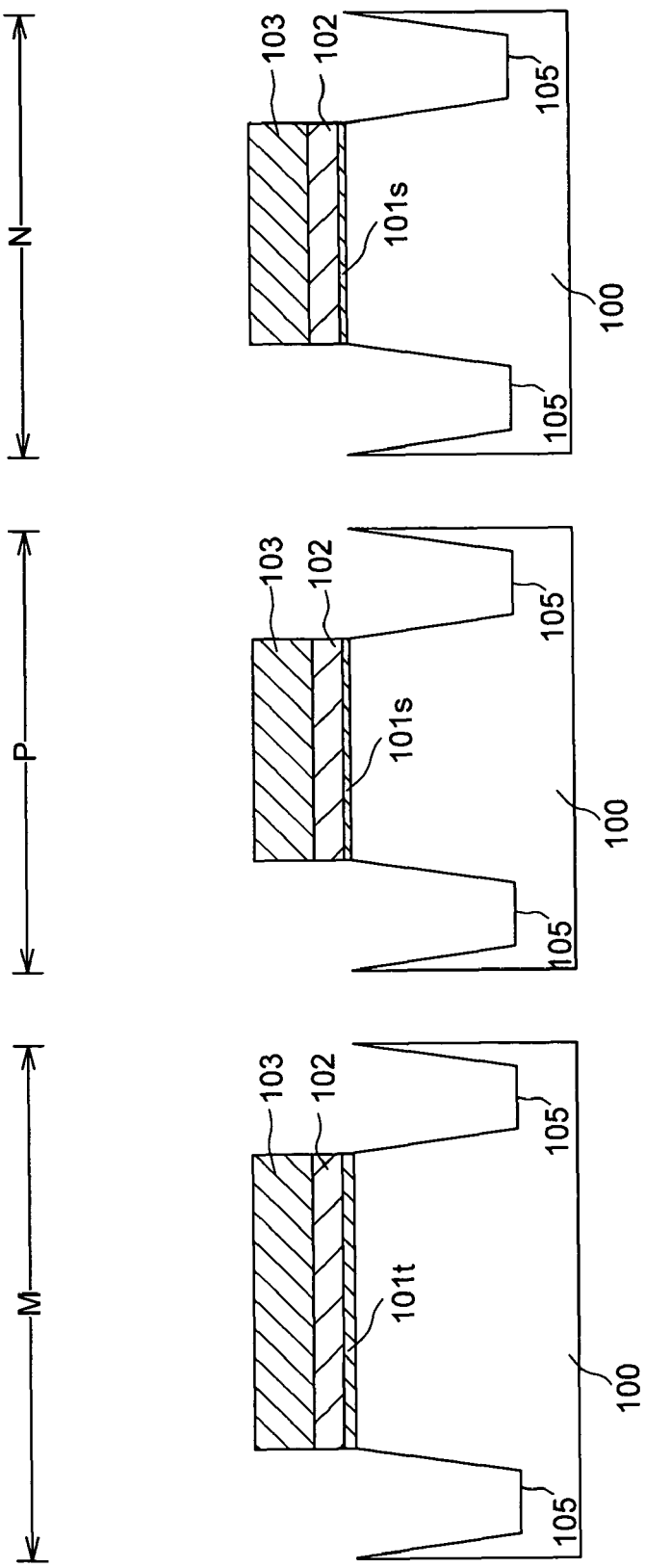
FIG. 22 is a process diagram showing a process of forming a trench used for STI that is a part of the manufacturing method of a semiconductor device according to the second embodiment of the present invention.

As shown in FIG. 22, after the silicon nitride films 103 are patterned using the resist patterns 104 as a mask, and the resist patterns 104 are then removed, the non-doped amorphous silicon films 102, the thick oxide films 101t, the thin oxide films 101s, and the semiconductor substrate 100 are dry-etched using the patterned silicon nitride films 103 as masks.

The non-doped amorphous silicon films 102, the thick oxide films 101t, and the thin oxide films 101s are thereby patterned, and trenches 105 used for STI are also formed in the semiconductor substrate 100.

Figure 23:
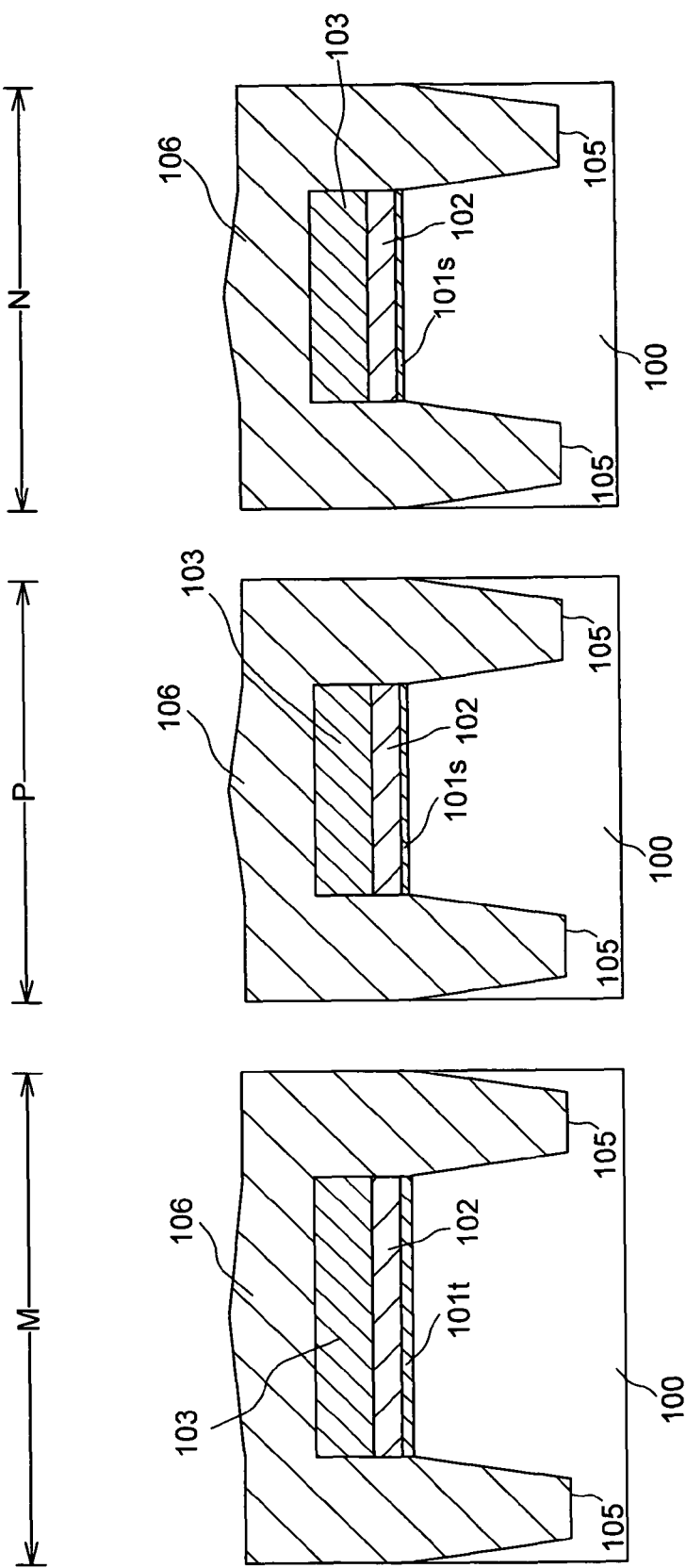
FIG. 23 is a process diagram showing a process of forming silicon oxide films that is a part of the manufacturing method of a semiconductor device according to the second embodiment of the present invention.

A thermal oxidation treatment is then performed in order to remove the etching damage from the inner walls of the trenches 105, after which silicon oxide films 106 are formed on the entire surface by an HDP (High-Density Plasma)-CVD method so as to fill in the trenches 105, as shown in FIG. 23.

Figure 24:
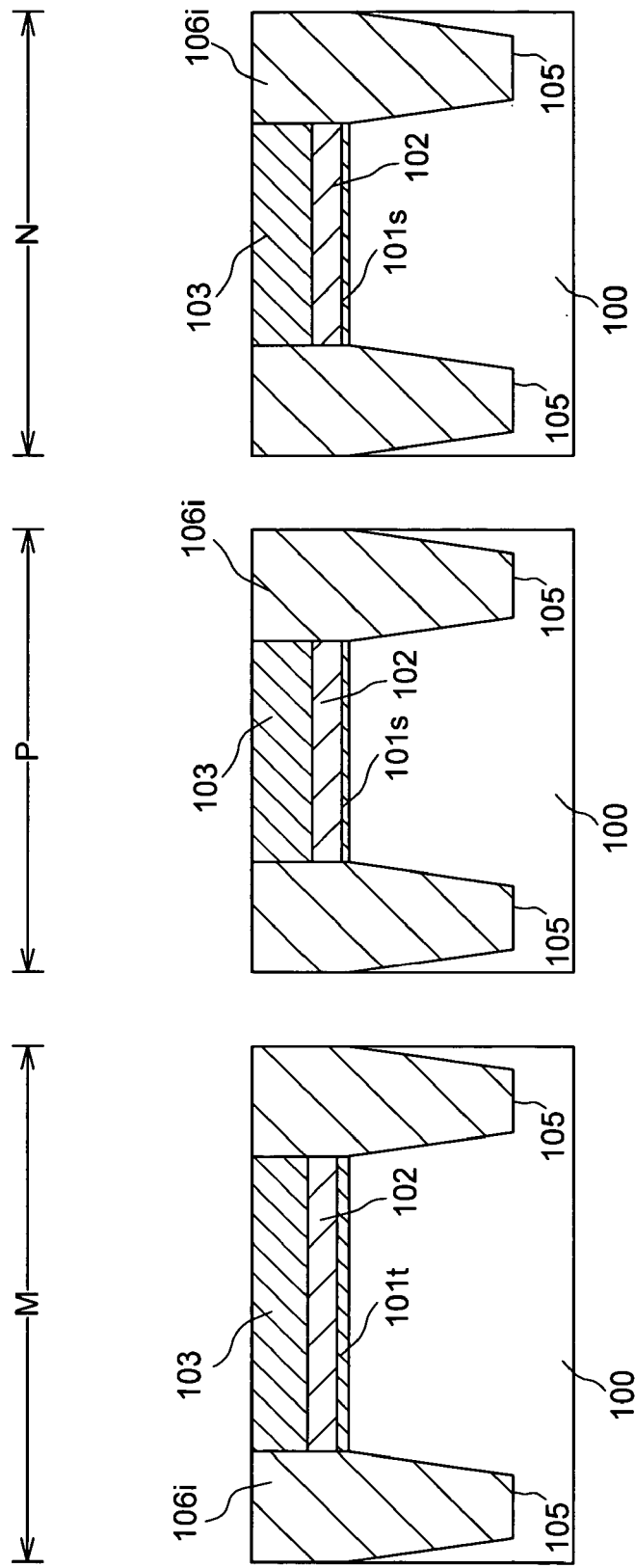
FIG. 24 is a process diagram showing a process of forming element separation regions that is a part of the manufacturing method of a semiconductor device according to the second embodiment of the present invention.

CMP (Chemical Mechanical Polishing) is then performed using the silicon nitride films 103 as a stopper, the silicon oxide films 106 on the silicon nitride films 103 are removed by polishing so that the silicon oxide films 106 remain in the trenches 105. Element separation regions 106i are thereby formed, as shown in FIG. 24.

Figure 25:
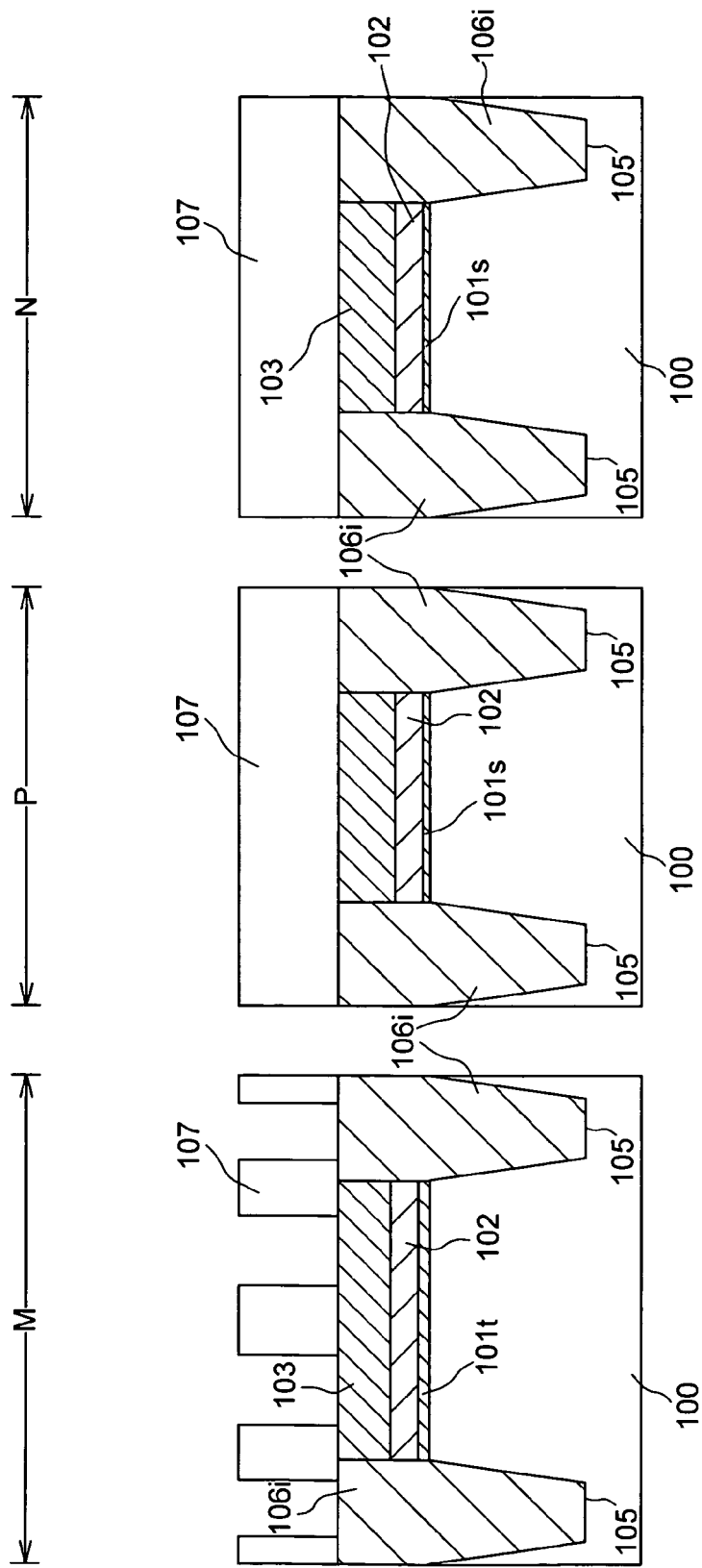
FIG. 25 is a process diagram showing a process of forming a resist pattern that is a part of the manufacturing, method of a semiconductor device according to the second embodiment of the present invention.

As shown in FIG. 25, a resist pattern 107 that is provided with a plurality of openings is then formed on region M in order to form the gate trenches of the trench-gate memory cell transistor in region M. Regions P and N are completely covered at this time by resist patterns 107.

Figure 26:
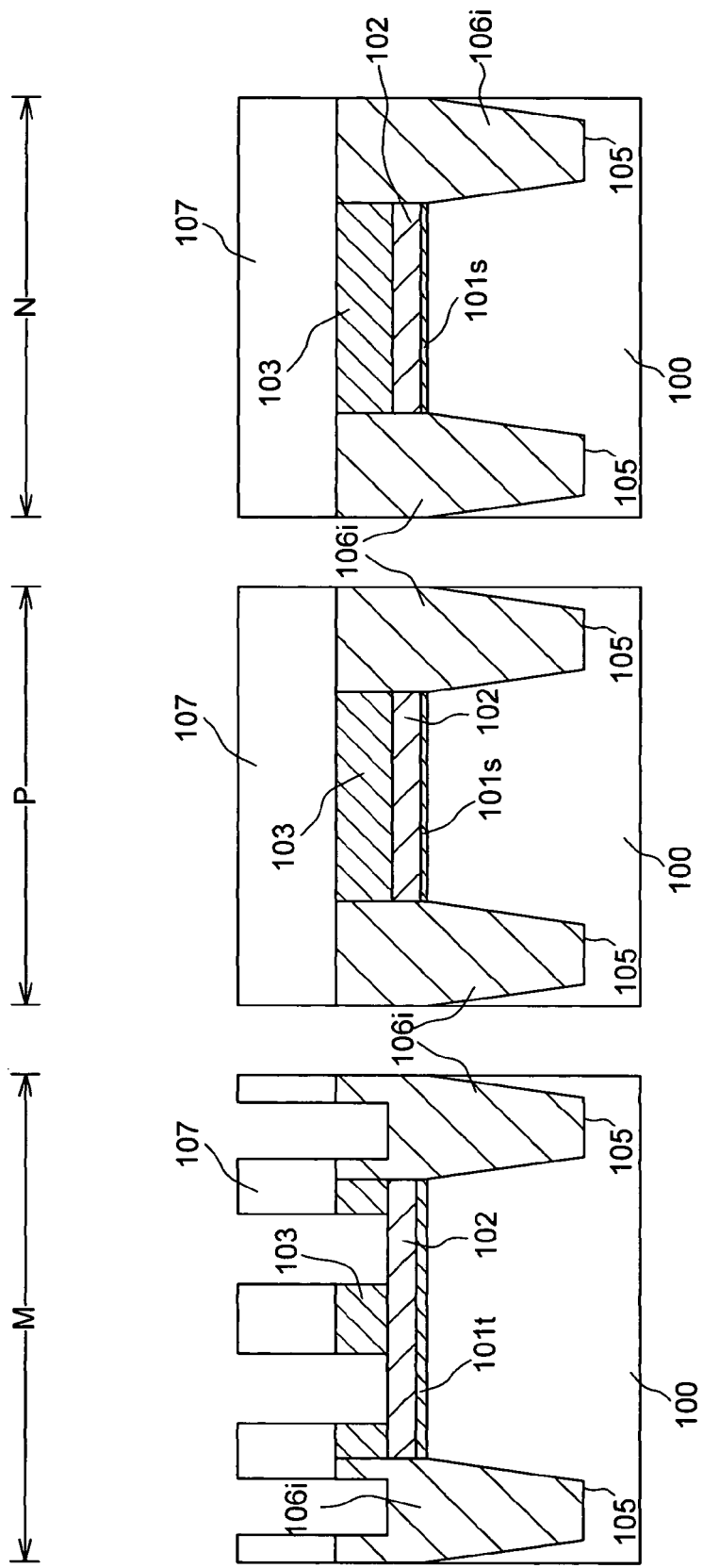
FIG. 26 is a process diagram showing a process of patterning the silicon nitride film that is a part of the manufacturing method of a semiconductor device according to the second embodiment of the present invention.

Using the resist pattern 107 as a mask, the silicon nitride film 103 is then patterned in the shape of the mask, as shown in FIG. 26.

Figure 27:
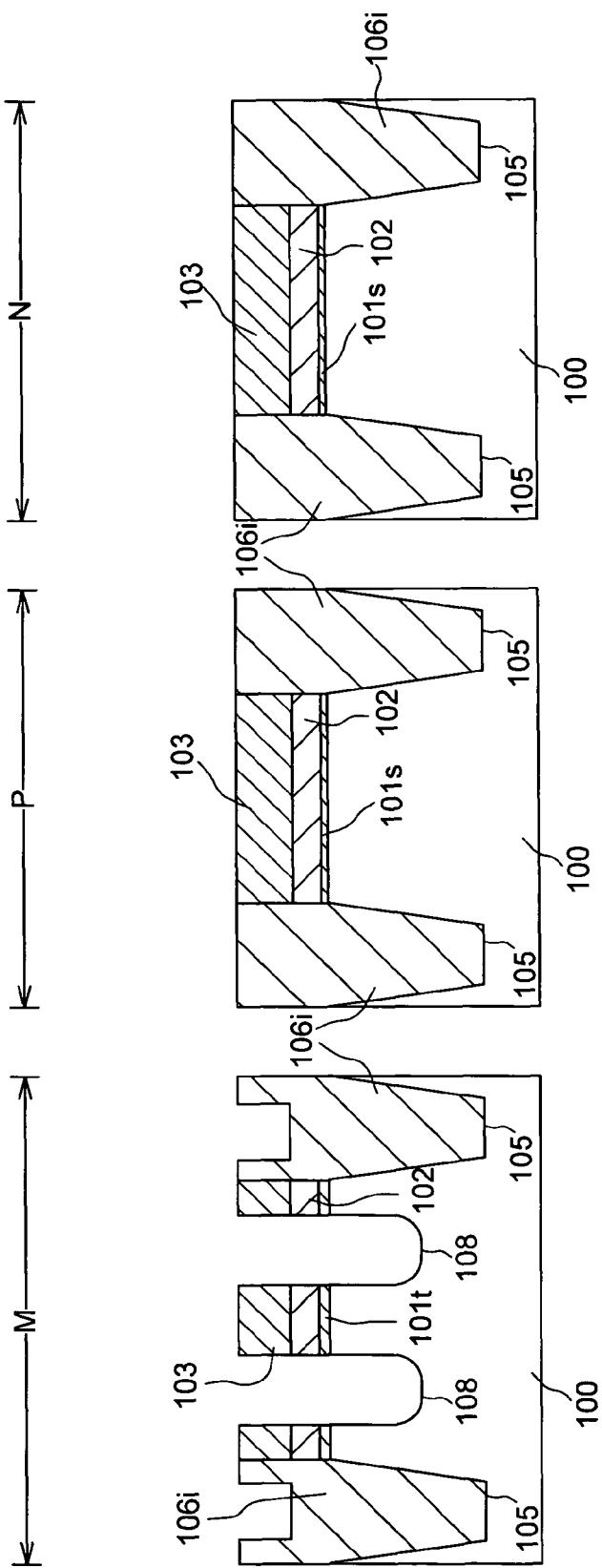
FIG. 27 is a process diagram showing a process of forming gate trenches that is a part of the manufacturing method of a semiconductor device according to the second embodiment of the present invention.

After the resist pattern 107 is removed, the non-doped amorphous silicon film 102 and the thick oxide film 101t are etched, and the semiconductor substrate 100 is also etched, whereby gate trenches 108 are formed in the semiconductor substrate 100, as shown in FIG. 27. The silicon nitride film 103 that was used as a mask for forming the STI trenches 105 shown in FIG. 22 thus remains without being removed, and is also used as a mask for forming the gate trenches 108, as shown in FIG. 27.

Figure 28:
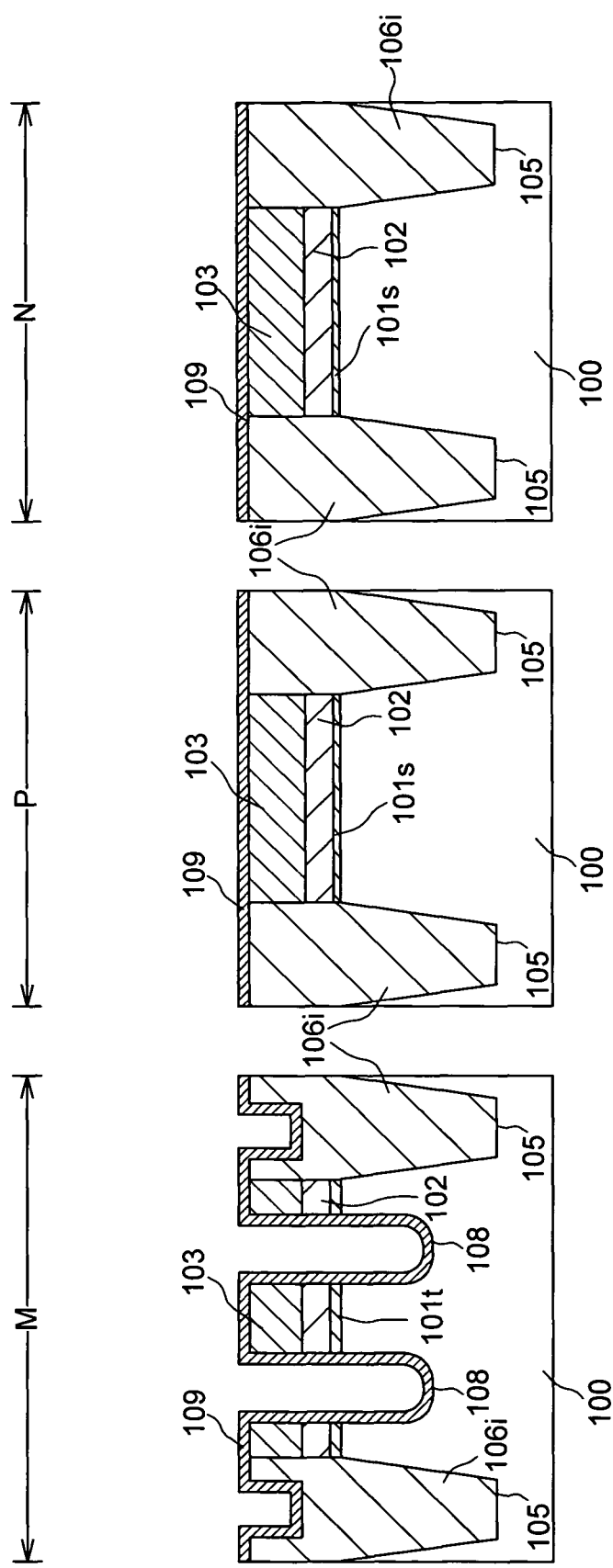
FIG. 28 is a process diagram showing a process of forming a silicon oxide film that is a part of the manufacturing method of a semiconductor device according to the second embodiment of the present invention.

Sacrificial oxidation is then performed by thermal oxidation to remove damage and contamination from the etched surfaces inside the gate trenches 108, and the sacrificial oxide film is then removed by wet etching. A silicon oxide film 109 is then formed to act as the gate insulating film of the memory cell transistor, as shown in FIG. 28. This silicon oxide film 109 is the gate insulating film of the memory cell transistor, and therefore must have a high breakdown voltage, as in the first embodiment, and the thickness thereof is preferably about B 4.5 to 6 nm. This silicon oxide film 109 can be formed in the same manner as the silicon oxide film 19 formed in the steps of the first embodiment shown in FIG. 10. The thin oxide film 101s formed on the semiconductor substrate 100 of regions P and N is covered at this time by a non-doped amorphous silicon film 102, which is a protective film. It is therefore possible to prevent an oxide film from being further deposited on the thin oxide film 101s, and to prevent the thin oxide film 101s from increasing in thickness due to thermal oxidation.

Figure 29:
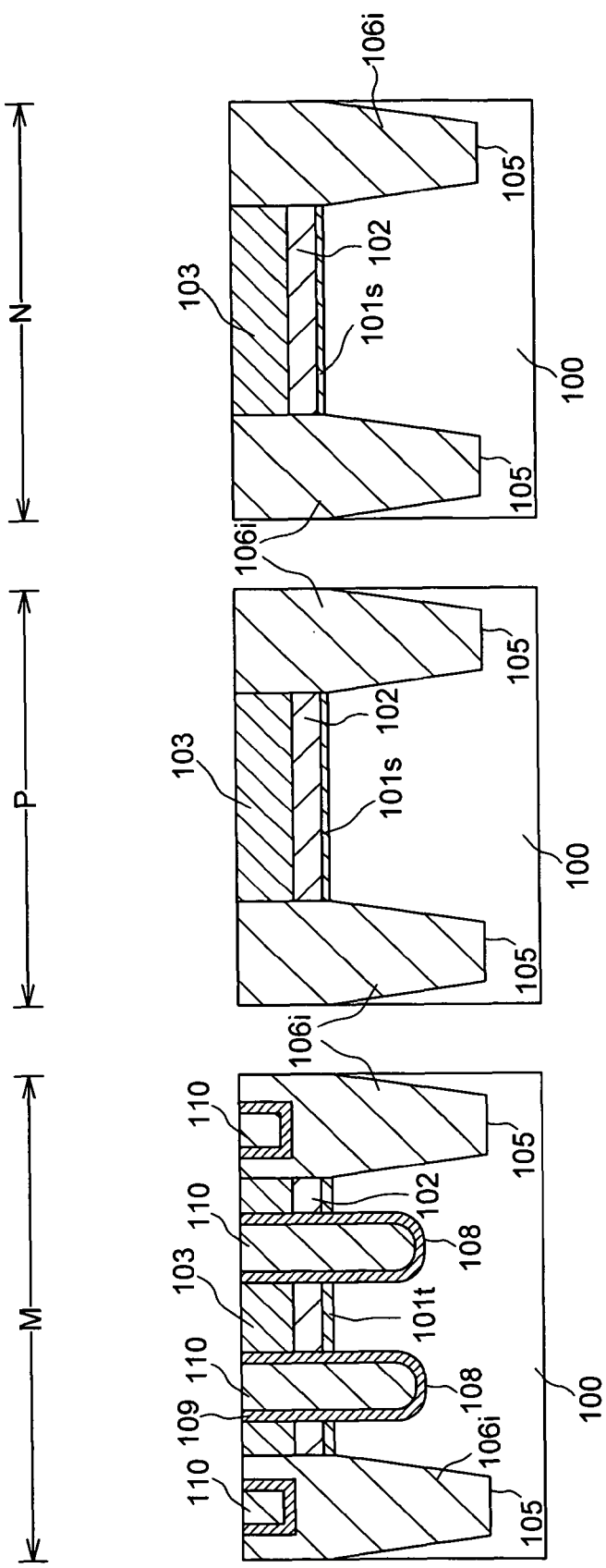
FIG. 29 is a process diagram showing a process of forming a phosphorus-doped amorphous silicon films into gate trenches that is a part of the manufacturing method of a semiconductor device according to the second embodiment of the present invention.

In order to form the gate electrode of the trench-gate transistor, an amorphous silicon film that is doped with phosphorus as an N-type impurity is then formed on the entire surface that includes the insides of the gate trenches 108. Phosphorus-doped amorphous silicon films 110 are then embedded in the gate trenches 108 as shown in FIG. 29, by performing a planarization process according to a CMP method in which the silicon nitride film 103 is used as a stopper.

Figure 30:
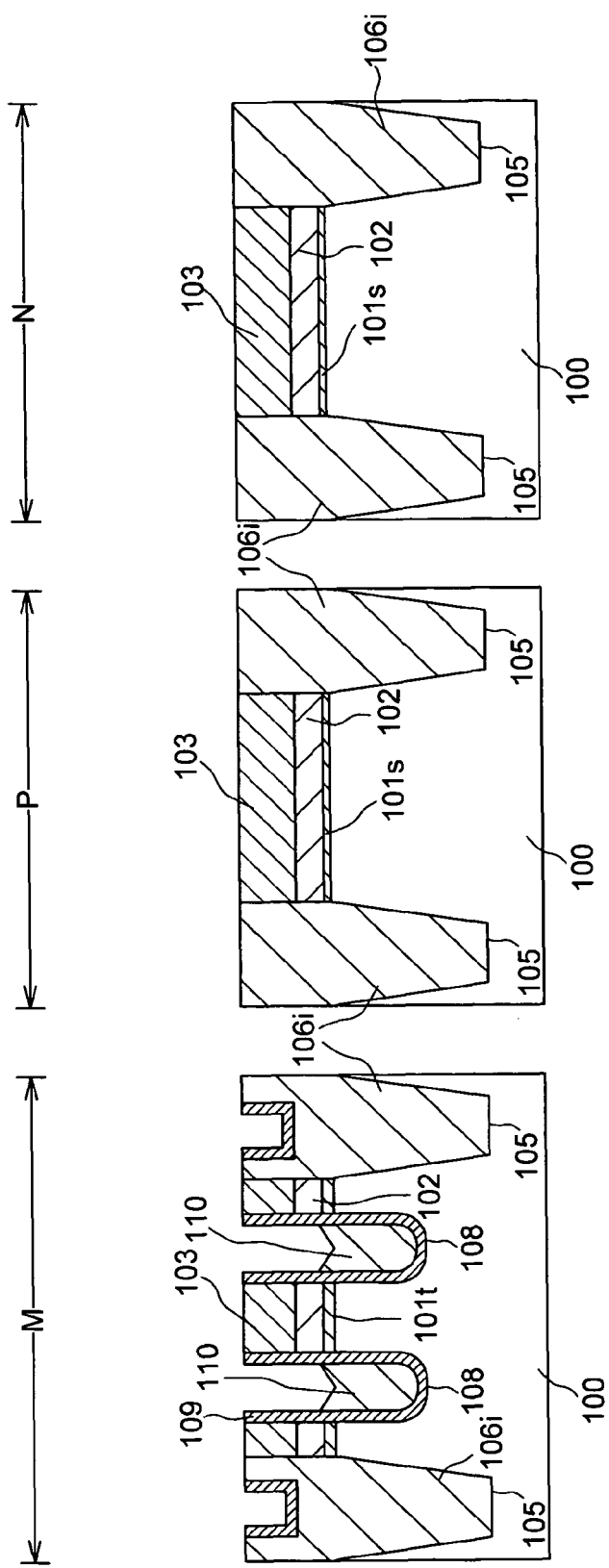
FIG. 30 is a process diagram showing a process of etching-back the phosphorus-doped amorphous silicon films that is a part of the manufacturing method of a semiconductor device according to the second embodiment of the present invention.

The phosphorus-doped amorphous silicon films 110 in the gate trenches 108 are then etched back to about the same position as the thick oxide film 101t by dry etching, as shown in FIG. 30.

Figure 31:
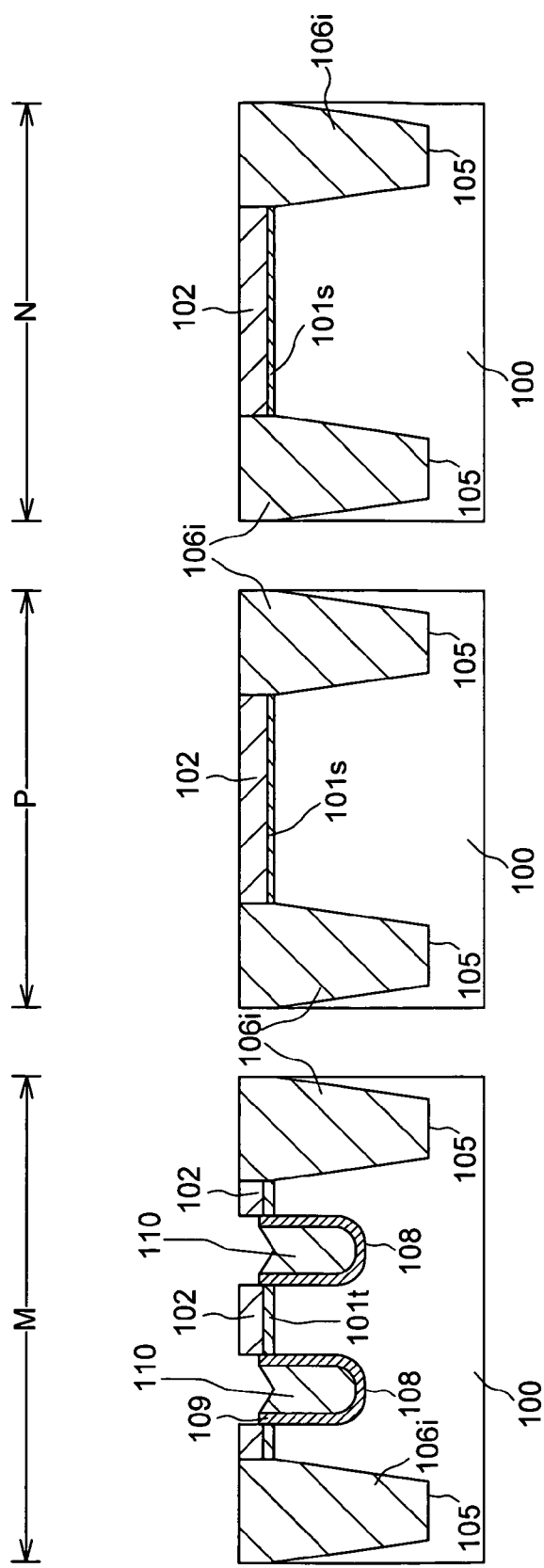
FIG. 31 is a process diagram showing a process of removing the silicon nitride film, the upper portions of the element separation regions, and the upper portions of the silicon oxide films that is a part of the manufacturing method of a semiconductor device according to the second embodiment of the present invention.

Wet etching is then performed to remove the silicon nitride film 103, the upper portions of the element separation regions 106i, and the upper portions of the silicon oxide films 109. The upper surfaces of the element separation regions 106i and the protective film (non-doped amorphous silicon film) 102 are thereby aligned with each other, as shown in FIG. 31.

Figure 32:
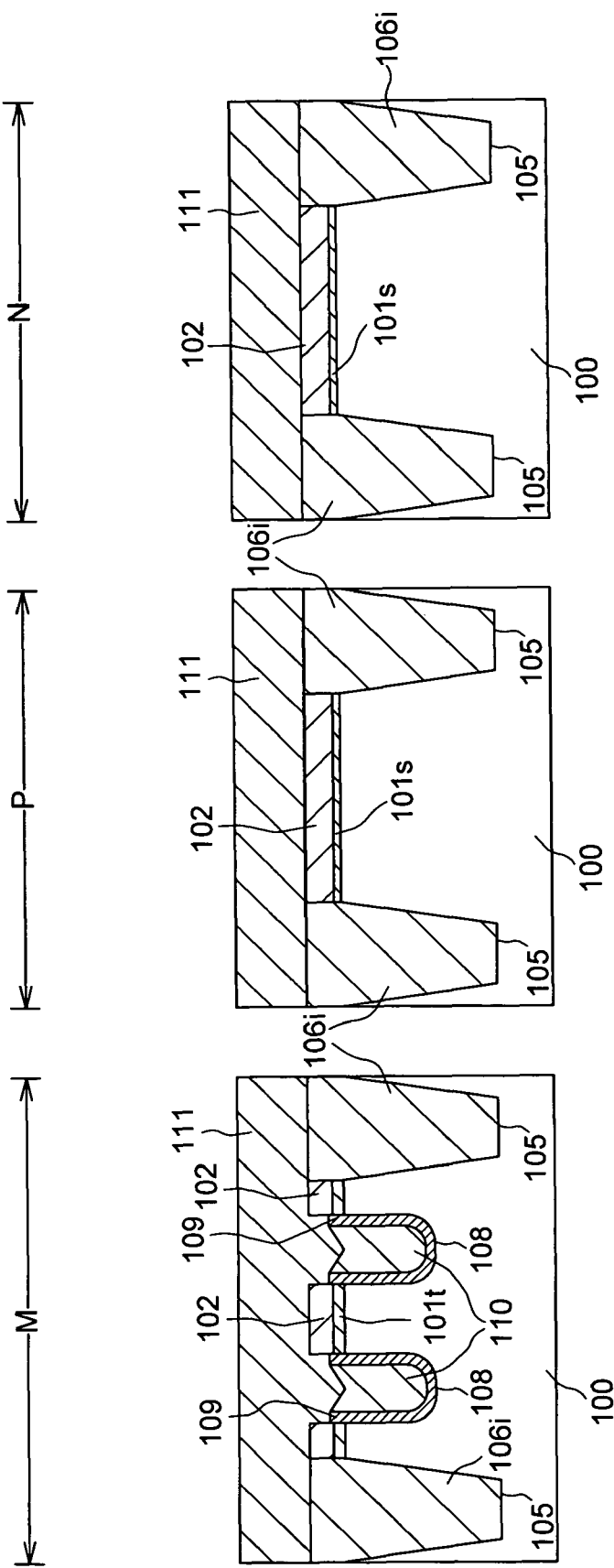
FIG. 32 is a process diagram showing a process of forming a non-doped amorphous silicon film that is a part of the manufacturing method of a semiconductor device according to the second embodiment of the present invention.

A CVD method is then used to form a non-doped amorphous silicon film 111 having a thickness of approximately 30 to 80 nm to become the gate electrode of the dual-gate transistor, as shown in FIG. 32. Also unlike the abovementioned first embodiment, a dual-gate-structured transistor is formed in regions P and N in the present embodiment. A non-doped amorphous silicon film is therefore used instead of a doped amorphous silicon film as the film for forming the gate electrode.

Figure 33:
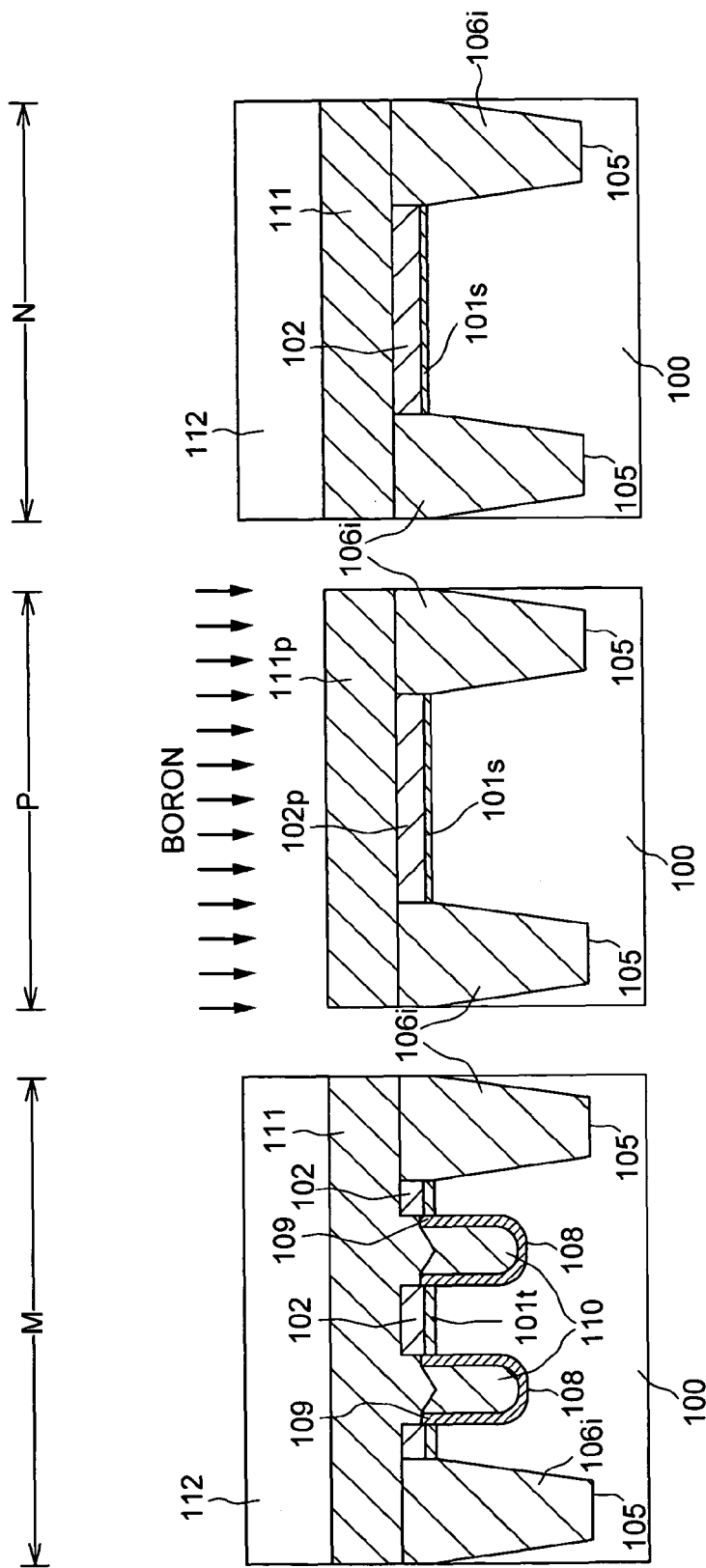
FIG. 33 is a process diagram showing a process of implanting boron ion that is a part of the manufacturing method of a semiconductor device according to the second embodiment of the present invention.

As shown in FIG. 33, regions M and N are then masked by a resist pattern 112, and boron (B) as a P-type impurity is ion-implanted into region P. This ion implantation of boron is performed at a low energy of 10 keV or less. The implanted boron ions are diffused in a subsequently performed heat treatment, whereby the non-doped amorphous silicon films 111 and 102 (see FIG. 32) of region P become P-type amorphous silicon films 111p and 102p.

Figure 34:
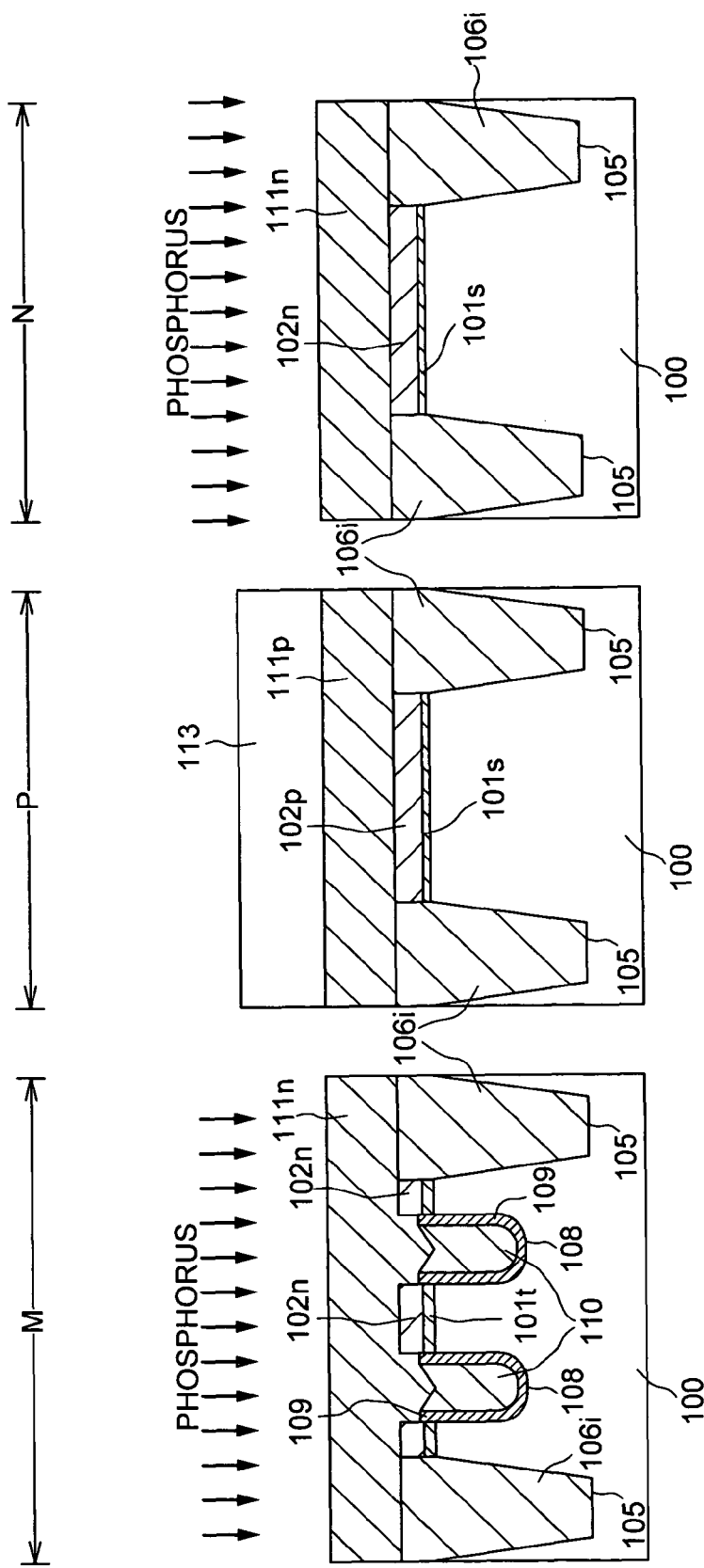
FIG. 34 is a process diagram showing a process of implanting phosphorus ion that is a part of the manufacturing method of a semiconductor device according to the second embodiment of the present invention.

After the resist pattern 112 is removed, region P in this instance is masked by a resist pattern 113, and phosphorus (P) as an N-type impurity is ion-implanted into regions M and N, as shown in FIG. 34. This ion implantation of phosphorus is also performed at a low energy of 20 keV or less, the same as the ion implantation of boron described above, and the phosphorus ions are diffused by a subsequent heat treatment. The non-doped amorphous silicon films 111 and 102 (see FIG. 33) of region N thereby become N-type amorphous silicon films 111n and 102n. The non-doped amorphous silicon films 111 and 102 of region M are also made into N-type amorphous silicon films 111n and 102n by this ion implantation.

According to the present embodiment, phosphorus-doped silicon films 110 are already embedded in the gate trenches 108 of region M. Ion implantation can therefore be performed under suitable implantation conditions according to the thickness of the silicon film 111 and the silicon film 102 without regard to implantation into the gate trenches 108 when ion implantation into region M is performed at the same time as phosphorus is implanted into region N in the ion implantation process for creating P-type and N-type non-doped silicon films 111, which are the gate electrodes of the dual-gate transistor.

Figure 35:
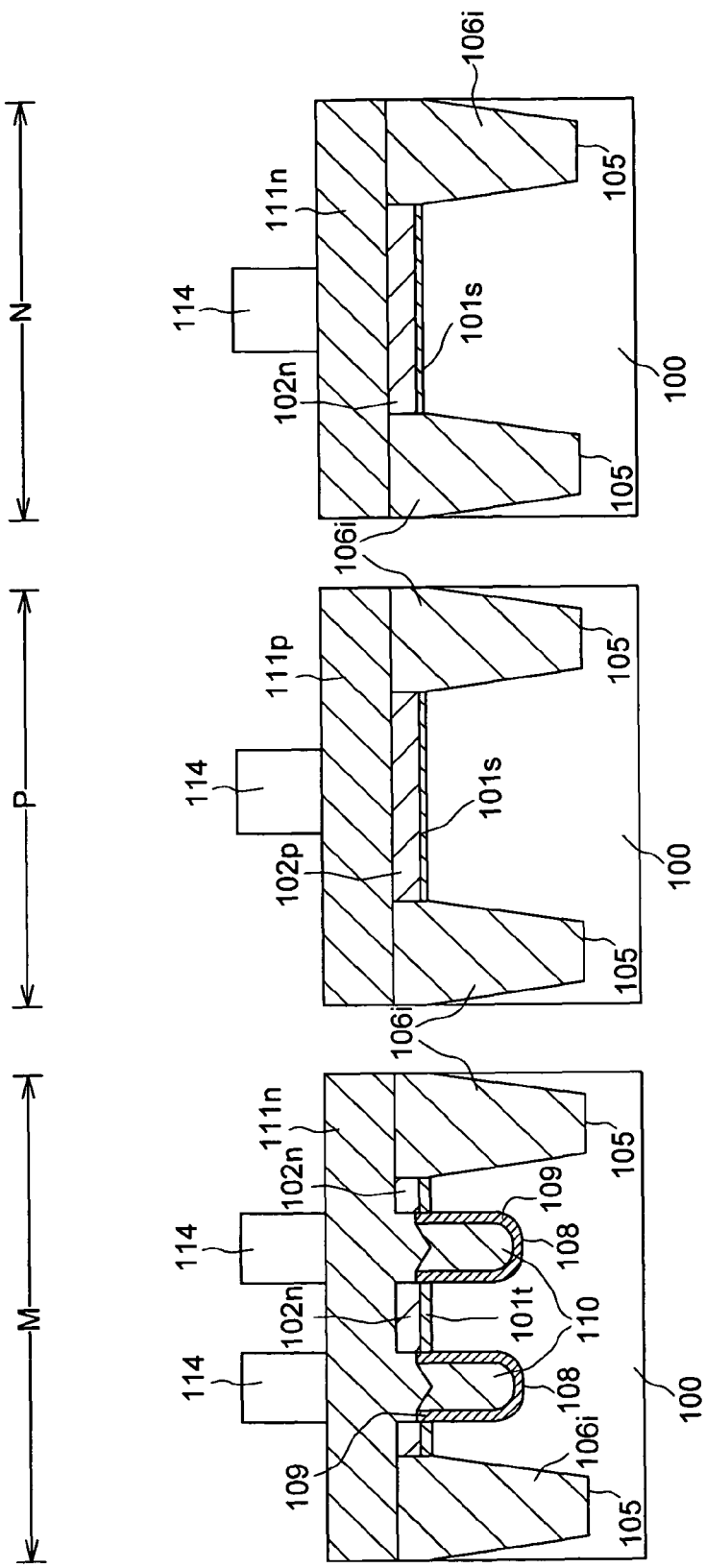
FIG. 35 is a process diagram showing a process of forming resist patterns that is a part of the manufacturing method of a semiconductor device according to the second embodiment of the present invention.

Resist patterns 114 for use in forming gate electrodes are then formed on the impurity-doped amorphous silicon films 111n and 111p, as shown in FIG. 35.

Figure 36:
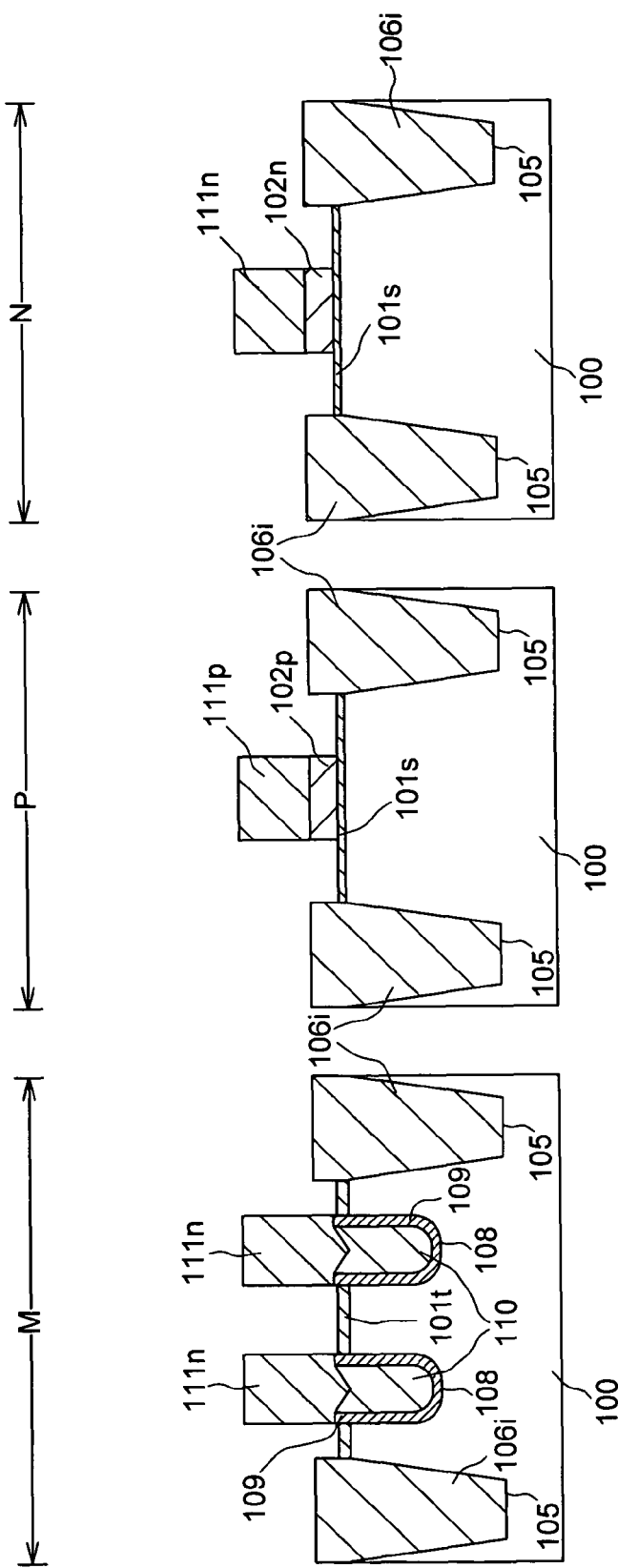
FIG. 36 is a process diagram showing a process of patterning layered films that is a part of the manufacturing method of a semiconductor device according to the second embodiment of the present invention.

As shown in FIG. 36, the layered film that includes the amorphous silicon films 111p and 102p, as well as the layered film that includes the amorphous silicon films 111n and 102n, are then each patterned using the resist pattern 114 as a mask. A gate electrode of a trench-gate transistor composed of doped amorphous silicon films 110 and 111n is thereby formed in region M, a P-type gate electrode composed of doped amorphous silicon films 111p and 102p is formed in region P, and an N-type gate electrode composed of doped amorphous silicon films 111n and 102n is formed in region N.

Figure 37:
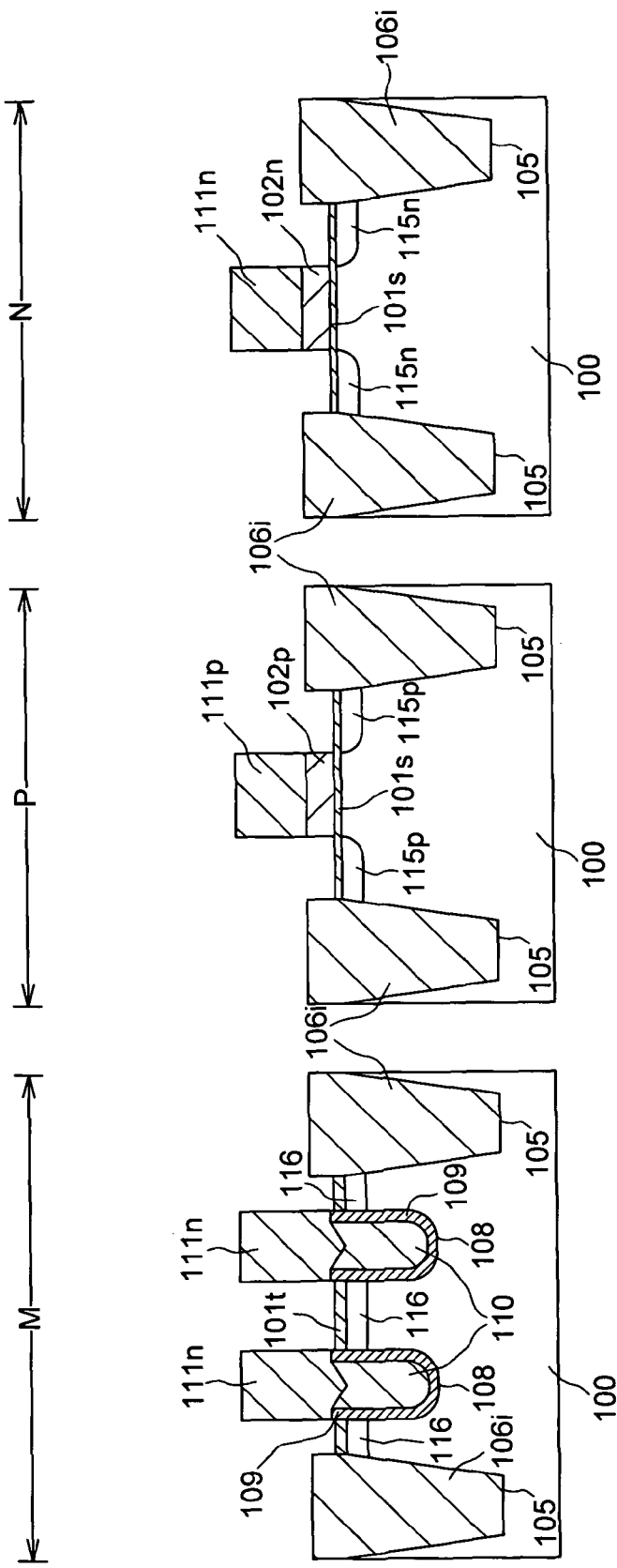
FIG. 37 is a process diagram showing a process of forming source/drain diffusion regions that is a part of the manufacturing method of a semiconductor device according to the second embodiment of the present invention.

As shown in FIG. 37, regions M and N are then covered by a resist film (not shown), and P-type source/drain diffusion regions 115p are formed by ion-implanting a P-type impurity into region P using the P-type gate electrode as a mask. Region P is then covered by a resist film (not shown), and an N-type impurity is ion-implanted into regions M and N using the gate electrodes of regions M and N as masks. N-type source/drain diffusion regions 115n are thereby formed in region N, and N-type source/drain diffusion regions 116 are formed in region M. According to this process, a trench-gate memory cell transistor is formed in region M, and a dual-gate transistor is formed in regions P and N, which are peripheral circuit regions.

The amorphous silicon films 111n, 111p, 102p, 102n, and 110 are converted from amorphous silicon films to polycrystalline silicon films by the heat treatment performed to activate the source/drain diffusion regions, or by a subsequent heating process.

Figure 38:
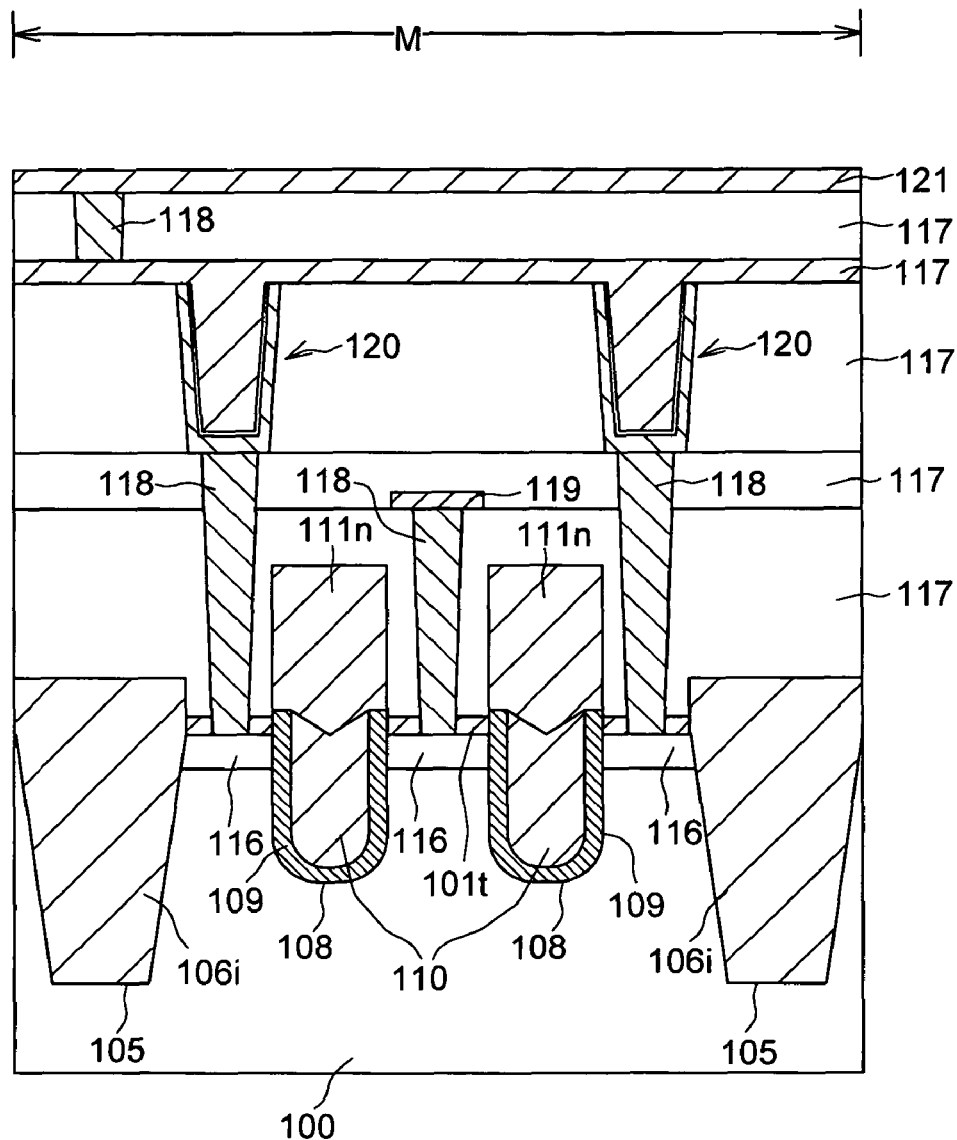
FIG. 38 is a process diagram showing a process of forming various wiring patterns and cell capacitors that is a part of the manufacturing method of a semiconductor device according to the second embodiment of the present invention.
Figure 39:
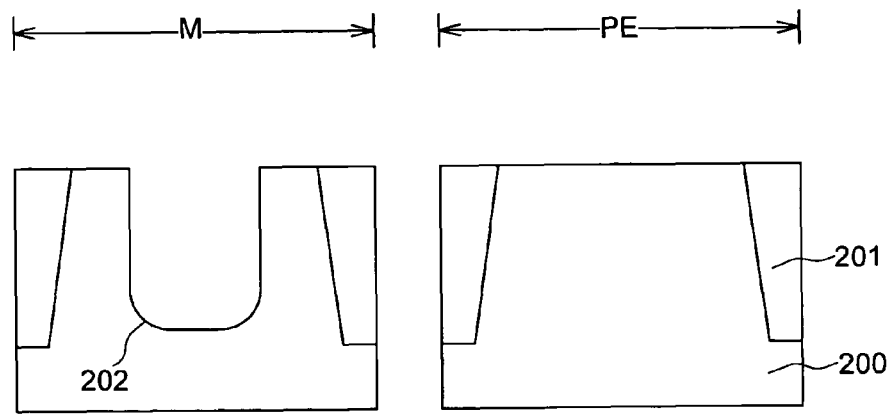
FIG. 39 is a process diagram showing a process of forming an STI and a gate trenchthat is a part of a conventional method.
Figure 40:
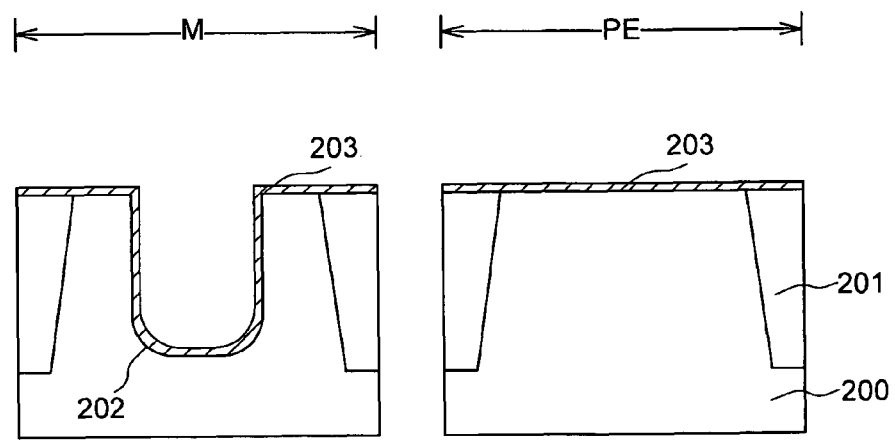
FIG. 40 is a process diagram showing a process of forming a silicon oxide film that is a part of the conventional method.
Figure 41:
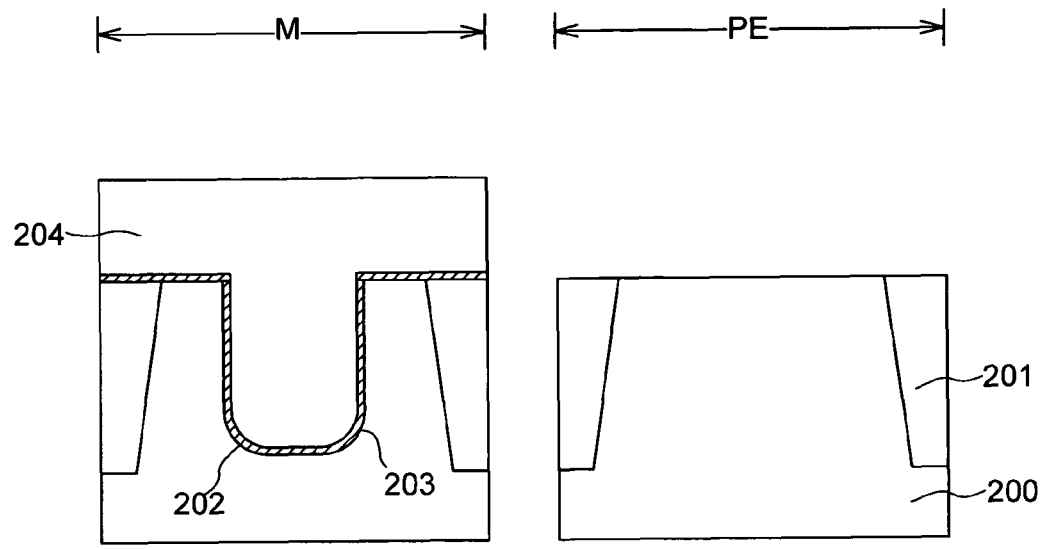
FIG. 41 is a process diagram showing a process of removing a resist pattern and the silicon oxide film formed on the region PE that is a part of the conventional method.
Figure 42:
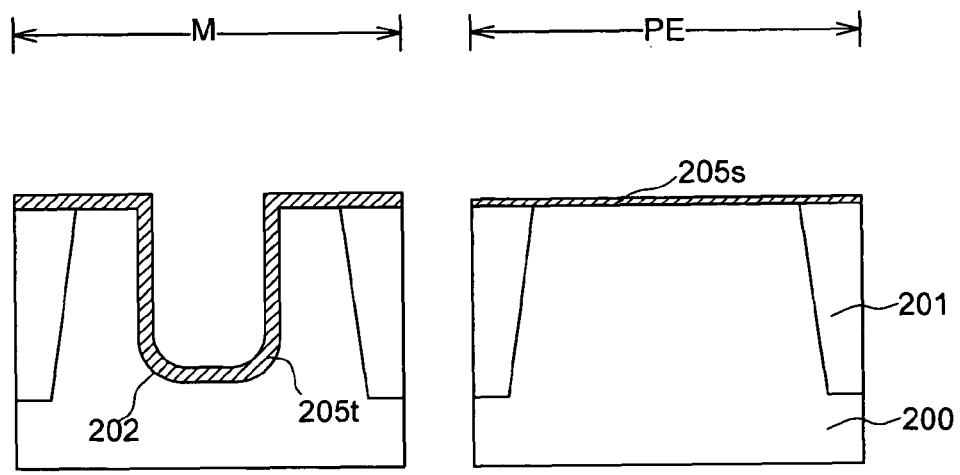
FIG. 42 is a process diagram showing a process of forming a thin oxide film and a thick oxide film that is a part of the conventional method.
Figure 43:
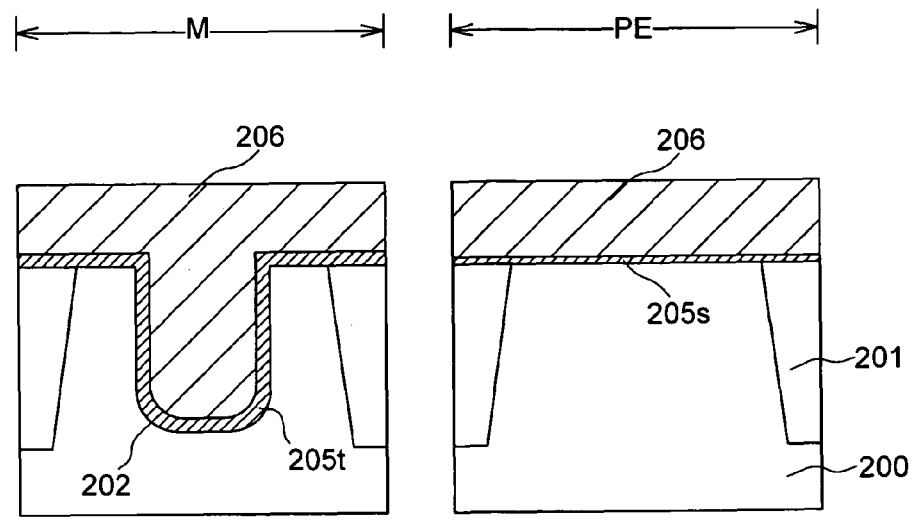
FIG. 43 is a process diagram showing a process of forming a doped silicon film that is a part of the conventional method.
Figure 44:
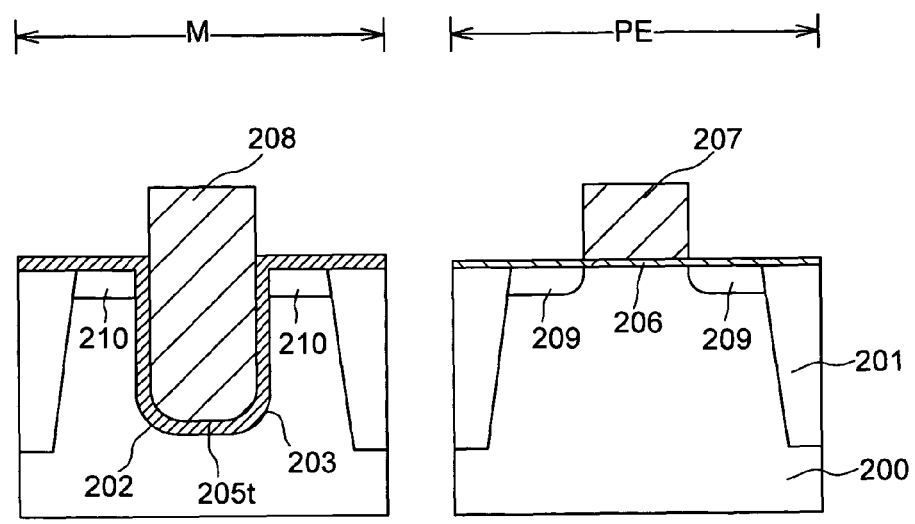
FIG. 44 is a process diagram showing a process of patterning the doped silicon film that is a part of the conventional method.

Various types of wiring or cell capacitors are then layered in region M using a common method similar to the first embodiment. Specifically, DRAM having a trench-gate memory cell transistor is formed by a process in which an interlayer insulating film 117 is formed on the memory cell transistor, and a contact plug 118 that pass through the interlayer insulating film 117, a bit line 119, a cell capacitor 120, Al wiring 121, and other components are formed, as shown in FIG. 38.

According to the present embodiment as described above, a thin oxide film 101s is formed in advance on the semiconductor substrate 100 of regions P and N in the peripheral circuit region to become the gate insulating film of the dual-gate-structured transistor that is formed in regions P and N. A gate trench 108 is then formed in the memory cell region M in a state in which the thin oxide film 101s is covered by an amorphous silicon film 102, and a gate insulating film 109 that is thicker than the gate insulating film 101s is formed on the inner wall of the gate trench 108, whereby the gate insulating film 101s and the gate insulating film 109 can be formed independently of each other. The same effects as those of the abovementioned first embodiment are thereby obtained.

Furthermore, according to the present embodiment, an amorphous silicon film 110 that is selectively doped with an impurity can be formed in the gate trench 108 of region M. Specifically, the following processes are involved in an example of a possible method for selectively forming doped silicon in the gate trench when a trench-gate transistor and a dual-gate-structured transistor are formed on the same substrate. After a gate trench is formed in a semiconductor substrate, a thermal oxide film serving as the gate insulating film of the transistors is formed in the gate trench and on the semiconductor substrate in the peripheral circuit region in which the dual-gate-structured transistor is formed, and a doped silicon film is formed on the entire surface that includes the inside of the gate trench. The doped silicon film is then etched back so as to remain only in the gate trench, a non-doped silicon film is formed on the gate insulating film to be used for the gate electrode of the dual-gate-structured transistor, and P- and N-type gate electrodes are each formed by ion implantation.

However, in this method, the gate insulating film of the dual-gate-structured transistor is usually damaged when the doped silicon is etched back, making it difficult to form a high-performance transistor. In the present embodiment, however, a non-doped amorphous silicon film 102 is formed on the gate insulating film 101s on regions P and N, which are the regions in which the dual-gate-structured transistor is formed, in the step for removing the silicon nitride film 103 that is used as a mask for forming the gate trench 108, the gate insulating film 109, the doped silicon film 110 that is embedded in the gate trench 108, and the gate trench 108. Damage to the gate insulating film 101s can thereby be prevented when the mask nitride film 103 is removed.

Accordingly, it is possible to form an impurity-doped amorphous silicon film 110 in the gate trench 108, and to form a non-doped amorphous silicon film 111 on regions P and N as well as on the doped amorphous silicon film 110 that was embedded in the gate trenches. The silicon films 110, 111, and 102 can thereby be formed in the appropriate impurity concentrations without damaging the gate insulating film 101s, and the trench-gate transistor and the dual-gate-structured transistor can both be endowed with high performance.

As described above, an amorphous silicon film 110 that is selectively doped with an impurity can be formed in the gate trench 108. Depletion of the trench-gate electrode can thereby be prevented in contrast to a case in which an impurity is introduced after a non-doped silicon film is formed in the gate trench.

The present invention is in no way limited to the aforementioned embodiments, but rather various modifications are possible within the scope of the invention as recited in the claims, and naturally these modifications are included within the scope of the invention.

For example, in the abovementioned embodiments, the protective film used for covering the thin oxide film 11s (101s) was a doped amorphous silicon film 12 in the first embodiment, and a non-doped amorphous silicon film 102 in the second embodiment. However, these configurations are not limiting, and another material may also be used insofar as the resulting film can prevent an oxide film from being layered on the thin oxide film 11s (101s) when the gate insulating film 19 (109) is formed in the gate trench 18 (108), or thickness from being increased due to further oxidation, while the operation of the transistors is not impeded. Specifically, another material may be used insofar as the resulting film (conductive thin film or the like) allows formation of a channel needed during the application of voltage to a gate electrode.

In the abovementioned embodiment, an example was described in which each silicon film was first formed in an amorphous state and then converted to a polycrystalline silicon film by a subsequent heating process. However, polycrystalline silicon films may also be used initially as needed.

In the embodiments described above, a layered film that included silicon films 12 (102) and 21 (111) was used as the gate electrode of the planar transistor, but the silicon film 12 (102), which is a protective film, may be formed in advance so as to initially have the required thickness as a gate electrode in cases in which the gate trench 108 or the STI trench 15 (105) has a small depth, and in other cases.

The gate electrode is also not necessarily formed using only silicon films, and it is also possible to form a silicide layer on a silicon film, or to create a so-called polymetal gate electrode by layering metal films.

Furthermore, the example described above was one in which the mask layer for forming the trenches 15 (105) that were used for STI, and the mask layer for forming the gate trenches 18 (108) were used in common in the silicon nitride film 13 (103). However, the silicon nitride film 13 (103) may be removed after the STI (element separation regions) 16i (106i) are formed, and a new silicon nitride film may be created to form a mask layer.

What is claimed is:

1. A method for manufacturing a semiconductor device that has a memory cell region and a peripheral circuit region, said method comprising the steps of:
forming a first gate insulating film on a semiconductor substrate in at least said peripheral circuit region;
covering said first gate insulating film with a protective film;
forming a gate trench in said memory cell region in a state in which said first gate insulating film on said peripheral circuit region is covered by said protective film; and forming a second gate insulating film that is thicker than said first gate insulating film on at least an inner wall of said gate trench in a state in which said first gate insulating film on said peripheral circuit region is covered by said protective film; and selectively removing the first gate insulating film to leave a portion of the first gate insulating film that serves as a gate insulating film of a transistor belonging to the peripheral circuit region.

2. The method for manufacturing a semiconductor device as claimed in claim 1, wherein said step of forming the second gate insulting film comprises:

depositing a silicon oxide film by a CVD method; and thermally oxidizing the interface between said silicon oxide film and said semiconductor substrate.

3. The method for manufacturing a semiconductor device as claimed in claim 1, further comprising filling in at least a portion of said gate trench by a conductive film.

4. The method for manufacturing a semiconductor device as claimed in claim 1, further comprising patterning said protective film and forming at least a portion of a gate electrode on said first gate insulating film in said peripheral circuit, region.

5. The method for manufacturing a semiconductor device as claimed in claim 3, further comprising patterning said protective film and forming at least a portion of a gate electrode on said first gate insulating film in said peripheral circuit region.

6. The method for manufacturing a semiconductor device as claimed in claim 1, wherein said protective film is a silicon film that is doped with an impurity.

7. The method for manufacturing a semiconductor device as claimed in claim 1, wherein said protective film is a non-doped silicon film; and said peripheral circuit region has first and second regions, the method further comprising introducing a P-type impurity and an N-type impurity into said non-doped silicon films on said first and second regions, respectively.

8. The method for manufacturing a semiconductor device as claimed in claim 1, wherein said first gate insulating film and said protective film are also formed on said semiconductor substrate in said memory cell region.

9. The method for manufacturing a semiconductor device as claimed in claim 8, wherein a thickness of said first gate insulating film on said memory cell region greater than a thickness of said first gate insulating film on said peripheral circuit region.

10. The method for manufacturing a semiconductor device as claimed in claim 1, wherein an element separation region for insulating and separating said memory cell region and said peripheral circuit region is formed subsequent to said steps of covering the first gate insulating film and forming the gate trench.

11. The method for manufacturing a semiconductor device as claimed in claim 10, wherein said element separation region has an STI structure; and said step of forming the gate trench includes forming a mask layer on said protective film, and forming a trench used for said element separation region using said mask layer.

12. The method for manufacturing a semiconductor device as claimed in claim 11, said mask layer is used also as a mask for forming said gate trench.

13. A method of manufacturing a semiconductor device including a memory cell region in which a trench transistor as a memory cell transistor is formed and a peripheral circuit region in which a planar transistor as a peripheral transistor is formed, the method comprising:

forming a first gate insulating film over the memory cell region and the peripheral circuit region, the gate insulating film thereby including a first portion over the memory cell region and a second portion over the peripheral circuit region;

forming a protective film over the first gate insulating film, the protective film thereby including a first portion over the first portion of the first gate insulating film and a second portion over the second portion of the first gate insulating film;

forming a trench in the memory cell first region by selectively removing the first portions of the first gate insulating film and the protective film;

forming a second gate insulating film over an surface of the trench, the second gate insulating film serving as a gate insulating film of the trench transistor and being larger in thickness than the first gate insulating film; and selectively removing the second portions of the first gate insulating film and the protective film to leave a part of the second portion of the first gate insulating film, the part of the second portion of the first gate insulating film serving as a gate insulating film of the planar transistor.

14. The method as claimed in claim 13, wherein the gate insulating film of the trench transistor is larger in thickness than the gate insulating film of the planar transistor.

15. The method as claimed in claim 13, wherein the protective film comprises a semiconductor film and the second portion of the semiconductor film serves as a part of a gate electrode of the planar transistor.

16. The method as claimed in claim 15, further comprising filling the trench with a gate electrode of the trench transistor with an intervention of the gate insulating film of the trench transistor.

17. The method as claimed in claim 15, wherein the semiconductor film comprises an amorphous silicon film.

* * * * *